United States Patent
Hu et al.

(10) Patent No.: US 12,221,718 B2
(45) Date of Patent: Feb. 11, 2025

(54) SYSTEMS AND METHODS FOR CONTROLLING A GAS DOPANT VAPORIZATION RATE DURING A CRYSTAL GROWTH PROCESS

(71) Applicant: GlobalWafers Co., Ltd., Hsinchu (TW)

(72) Inventors: Chieh Hu, Chiayi (TW); Hsien-Ta Tseng, Zhunan (TW); Chun-Sheng Wu, Hsinchu (TW); William Lynn Luter, St. Charles, MO (US); Liang-Chin Chen, Zhubei (TW); Sumeet Bhagavat, St. Charles, MO (US); Carissima Marie Hudson, St. Charles, MO (US); Yu-Chiao Wu, Frontenac, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 244 days.

(21) Appl. No.: 18/046,319

(22) Filed: Oct. 13, 2022

(65) Prior Publication Data
US 2024/0125004 A1 Apr. 18, 2024

(51) Int. Cl.
*C30B 15/04* (2006.01)
*C30B 15/14* (2006.01)
*C30B 15/20* (2006.01)
*C30B 29/06* (2006.01)

(52) U.S. Cl.
CPC ............ *C30B 15/04* (2013.01); *C30B 15/14* (2013.01); *C30B 15/20* (2013.01); *C30B 29/06* (2013.01)

(58) Field of Classification Search
CPC .......... C30B 15/04; C30B 15/14; C30B 29/06; Y10T 117/1056
See application file for complete search history.

(56) References Cited

U.S. PATENT DOCUMENTS

| | | | |
|---|---|---|---|
| 11,982,019 B2 * | 5/2024 | Chu | ................... C30B 15/04 |
| 2010/0294999 A1 * | 11/2010 | Narushima | ............. C30B 15/04 117/214 |
| 2016/0017513 A1 * | 1/2016 | Haringer | ................. C30B 15/04 117/19 |
| 2018/0237937 A1 | 8/2018 | Kang et al. | |
| 2019/0345629 A1 | 11/2019 | Haringer et al. | |
| 2020/0407869 A1 | 12/2020 | Luter et al. | |

(Continued)

FOREIGN PATENT DOCUMENTS

| | | |
|---|---|---|
| JP | 2018070428 A | 5/2018 |
| TW | I767814 B | 6/2022 |

(Continued)

*Primary Examiner* — Robert M Kunemund
(74) *Attorney, Agent, or Firm* — Armstrong Teasdale LLP

(57) ABSTRACT

A method of growing a single crystal ingot includes growing a single crystal silicon ingot from a silicon melt in a crucible within an inner chamber, adding a volatile dopant into a feed tube, positioning the feed tube within an inner chamber at a first height relative to a surface of the melt, adjusting the feed tube within the inner chamber to a second height at a speed rate, and heating the volatile dopant to form a gaseous dopant as the feed tube is moved from the first height to the second height at the speed rate. Each of the second height and the speed rate are selected to control a vaporization rate of the volatile dopant. The method also includes introducing dopant species into the melt while growing the ingot by contacting the surface of the melt with the gaseous dopant.

20 Claims, 12 Drawing Sheets

(56) References Cited

U.S. PATENT DOCUMENTS

| | | | |
|---|---|---|---|
| 2022/0194586 A1* | 6/2022 | Huijsing | ................. H01Q 1/28 |
| 2022/0205131 A1* | 6/2022 | Wu | ........................ C30B 29/06 |
| 2022/0205132 A1 | 6/2022 | Wu et al. | |

FOREIGN PATENT DOCUMENTS

| | | |
|---|---|---|
| WO | 2016179022 A1 | 11/2016 |
| WO | 2022194586 A1 | 9/2022 |

\* cited by examiner

SYSTEMS AND METHODS FOR CONTROLLING A GAS DOPANT VAPORIZATION RATE DURING A CRYSTAL GROWTH PROCESS

FIELD

The field relates generally to preparation of single crystals of semiconductor material and, more specifically, to systems and methods for controlling a gas dopant vaporization rate during a crystal growth process.

BACKGROUND

Single crystal silicon, which is the starting material for most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon or silicon melt, and a single crystal ingot is grown by slow extraction.

A certain amount of dopant is added to the melt to achieve a desired resistivity in the silicon crystal. Conventionally, dopant is fed into the melt from a feed hopper located a few feet above the silicon melt level. However, this approach is not favorable for volatile dopants because such dopants tend to vaporize uncontrolled into the surrounding environment, resulting in the generation of oxide particles (i.e., suboxides) that may fall into the melt and become incorporated into the growing crystal. These particles act as heterogeneous nucleation sites, and ultimately result in failure of the crystal pulling process.

Further, in conventional systems, the sublimation of dopant granules at the melt surface often causes a local temperature reduction of the surrounding silicon melt, which in turn results in the formation of "silicon boats" adjacent the dopant granules. These silicon boats, along with the surface tension of the melt, prevent many of the dopant granules that do reach the melt surface from sinking into the melt, thus increasing the time during which sublimation to the atmosphere may occur. This phenomenon results in a significant loss of dopant to the gaseous environment and further increases the concentration of contaminant particles in the growth chamber.

Some known dopant systems introduce volatile dopants into the growth chamber as a gas. Gas dopants may be formed by vaporizing the volatile dopants in the feed hopper. The gas dopants so formed exit the feed hopper and subsequently contact a surface of the melt and flux into the melt. The dopant species in the melt are then transported, by diffusion and convection, from the surface of the melt toward the solid-liquid interface formed by the growing single crystal ingot. However, such systems tend to supply dopant non-uniformly during a growth process, thereby increasing the variation in dopant concentration in the radial and/or axial direction of the grown ingot.

In some doping systems, inert gas is used to feed volatile dopants into a growth chamber and/or carry gas dopants from the feed hopper to the surface of the silicon melt. However, the use of inert gas tends to dilute the gaseous dopant, thereby decreasing the dopant concentration, and purge the evaporated dopant from the growth chamber too quickly. For example, dopants with low segregation coefficients such as arsenic (0.3) and phosphorus (0.35) require dopant concentrations in the melt of about 3 times higher than the desired dopant concentration in the grown crystal. As a result, the evaporated dopant does not have sufficient time to flux into the silicon melt, and more dopant is needed to achieve a desired dopant concentration in the silicon melt.

Accordingly, a need exists for a simple, cost-effective approach to produce doped single crystal silicon by a crystal pulling process. A need also exists for doping methods that facilitate control over the introduction of gas dopant species into a silicon melt during a crystal pulling process. Further, a need exists for gas doping methods that allow for use of dopant source materials that are readily available and/or relatively inexpensive and that allow the melt to be doped with relative ease.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a method of growing a doped single crystal silicon ingot using an ingot pulling apparatus is disclosed. The ingot pulling apparatus includes an inner chamber, a crucible disposed within the inner chamber, a heat source, and a feed tube having an open end. The feed tube includes a capsule proximate the open end. The method includes adding polycrystalline silicon to the crucible, heating, by the heat source, the crucible to form a silicon melt from the polycrystalline silicon in the crucible, and growing a single crystal silicon ingot from the melt by contacting the melt with a seed crystal and pulling the seed crystal away from the melt to grow the single crystal silicon ingot. The single crystal silicon ingot has a neck region, a shoulder region, and a body region. The method also includes adding a charge of a volatile dopant into the feed tube, the charge of the volatile dopant being received by the capsule. The method further includes positioning the feed tube within the inner chamber such that the open end of the feed tube has a first height relative to a surface of the melt. The method also includes adjusting the feed tube within the inner chamber to move the open end of the feed tube from the first height to a second height relative to the surface of the melt. The second height is smaller than the first height, and the open end of the feed tube is moved from the first height to the second height at a speed rate. The method also includes heating, by the heat source and radiant heat from the surface of the melt, the capsule containing the volatile dopant to form a gaseous dopant as the open end is moved from the first height to the second height at the speed rate. Each of the second height and the speed rate are selected to control a vaporization rate of the volatile dopant. The method also includes introducing dopant species into the melt while growing the body region of the single crystal silicon ingot by contacting the surface of the melt with the gaseous dopant. The vaporization rate is controlled such that the dopant species are introduced at a rate sufficient to maintain a resistivity of the body region over an axial length of the body region.

In another aspect, an ingot pulling apparatus for growing a doped single crystal silicon ingot is disclosed. The apparatus includes an outer housing defining an inner chamber and a crucible disposed within the inner chamber for holding a silicon melt. The apparatus also includes a gas doping system for introducing dopant species into the melt. The gas doping system includes a feed tube extending between a first end and a second end, the second end located in the inner chamber. The feed tube also includes a capsule disposed proximate the second end. The gas doping system also includes a dopant feed source coupled in flow communication with the first end of the feed tube, the dopant feed source being configured to add a volatile dopant to the feed tube. The gas doping system also includes a positioning system configured to adjust the position of the feed tube between a first position, in which the second end of the feed tube is at a first height above a surface of the melt, and a second position, in which the second end of the feed tube is at a second height above the surface of the melt that is smaller than the first height. The gas doping system also includes a controller communicatively coupled to the dopant feed source and the positioning system. The controller is configured to cause the dopant feed source to add a targeted amount of the volatile dopant to the feed tube and to cause the positioning system to move the feed tube to the second position at a speed rate. Each of the second height and the speed rate are selected to control a vaporization rate of the volatile dopant in the feed tube during an ingot pulling process.

In another aspect, an ingot pulling apparatus for growing a doped single crystal silicon ingot is disclosed. The apparatus includes an outer housing defining an inner chamber and a crucible disposed within the inner chamber for holding a silicon melt. The apparatus also includes a first gas doping system and a second gas doping system for introducing dopant species into the melt. Each of the first and second gas doping systems includes a feed tube extending between a first end and a second end, the second end located in the inner chamber. The feed tube also includes a capsule disposed proximate the second end. Each of the first and second gas doping systems also includes a dopant feed source coupled in flow communication with the first end of the feed tube, the dopant feed source being configured to add a volatile dopant to the feed tube. Each of the first and second gas doping systems also includes a positioning system configured to adjust the position of the feed tube between a first position, in which the second end of the feed tube is at a first height above a surface of the melt, and a second position, in which the second end of the feed tube is at a second height above the surface of the melt that is smaller than the first height. The gas doping system also includes a controller communicatively coupled to the dopant feed source and the positioning system. The controller is configured to cause the dopant feed source to add a targeted amount of the volatile dopant to the feed tube and to cause the positioning system to move the feed tube to the second position. The second height is selected to control a vaporization rate of the volatile dopant in the feed tube during an ingot pulling process.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Like reference symbols used in the various drawings indicate like elements.

DETAILED DESCRIPTION

Figure 1:
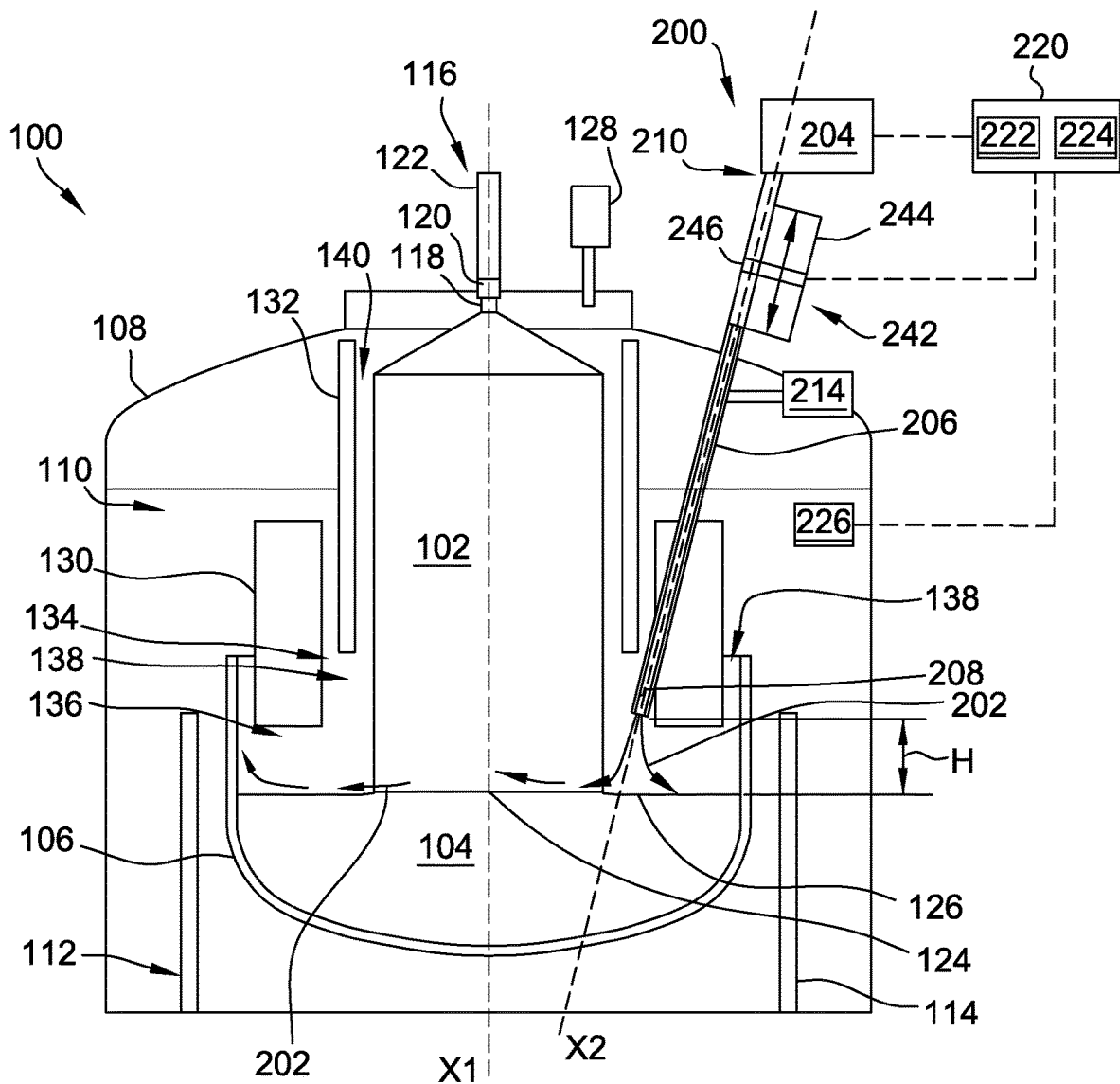
FIG. 1 is a schematic cross-section of an example ingot pulling apparatus including a gas doping system.

An example ingot pulling apparatus or ingot puller is indicated generally at 100 in FIG. 1. The ingot puller 100 is used to produce single crystal (i.e., monocrystalline) ingots 102 of semiconductor or solar-grade material such as, for example, single crystal silicon ingots 102. In some embodiments, the ingot 102 is grown by the so-called Czochralski (CZ) process in which the ingot 102 is withdrawn from a silicon melt 104 held within a crucible 106 of the ingot puller 100. In some embodiments, the ingot 102 is grown by a batch CZ process in which polycrystalline silicon is charged to the crucible 106 in an amount sufficient to grow one ingot 102, such that the crucible 106 is essentially depleted of silicon melt 104 after the growth of the one ingot 102. In other embodiments, the ingot 102 is grown by a continuous CZ (CCZ) process in which polycrystalline silicon is continually or periodically added to the crucible 106 to replenish the silicon melt 104 during the growth process. The CCZ process facilitates growth of multiple ingots 102 pulled from a single melt 104. Unless stated otherwise, embodiments of the subject matter described herein are not limited to a particular crystal growth process. For example, in other embodiments, a polycrystalline silicon ingot may be grown using a directional solidification process for solar applications.

Referring to FIG. 1, the ingot puller 100 includes an outer housing 108 that defines an inner chamber 110 within the housing 108. The crucible 106 is disposed within the inner chamber 110. The crucible 106 contains the silicon melt 104 from which the silicon ingot 102 is pulled. The crucible 106 may be supported by a susceptor (not shown). The ingot puller 100 may be configured to rotate the crucible 106 and/or move the crucible 106 vertically within the inner chamber 110.

To prepare the silicon melt 104, polycrystalline silicon is added to the crucible 106. The polycrystalline silicon is heated to above the melting temperature of silicon (about 1414° C.) to cause the polycrystalline silicon to liquefy into the silicon melt 104. A heat source 112 is operated to melt-down the polycrystalline silicon. For example, the heat source 112 includes one or more heaters 114 mounted within the inner chamber 110 below or to the side of (i.e., radially outward from) the crucible 106 are operated to melt-down the polycrystalline silicon to prepare the silicon melt 104.

Before or after the melt 104 is produced, the melt 104 may be doped with a dopant, typically an n-type dopant, to compensate for p-type impurities (e.g., boron) in the melt. The n-type dopant may be added before growth of the ingot 102. By compensating the melt 104, the resistivity of the resulting ingot 102 may be controlled to a targeted resistivity (e.g., increased). For example, the seed end of the ingot 102 (i.e., the portion of the ingot nearest the ingot crown) may have a resistivity of at least about 30 Ω-cm or, as in other embodiments, at least about 35 Ω-cm, at least about 40 Ω-cm, at least about 45 Ω-cm, at least about 50 Ω-cm, at least about 55 Ω-cm, at least about 60 Ω-cm, or from about 30 Ω-cm to about 100 ohm-cm, or from about 60 ohm-cm to about 80 ohm-cm. Suitable n-type dopants include phosphorous and arsenic.

Once the melt 104 is prepared, the single crystal silicon ingot 102 is pulled from the melt 104 using a pulling system 116. The pulling system 116 includes a pulling mechanism (not shown) attached to a pull wire 122 that extends down from the mechanism. The mechanism is capable of raising and lowering the pull wire 122 along a pull axis $X_1$ and rotating the pull wire 122 about the pull axis $X_1$. The ingot puller 100 may have a pull shaft rather than a wire, depending upon the type of puller. The pull wire 122 terminates at a seed chuck 120 that holds and/or is secured to a seed crystal 118. The pulling mechanism lowers the seed chuck 120 and crystal 118 along the pull axis $X_1$ until the seed crystal 118 contacts the surface of the silicon melt 104. Once the seed crystal 118 begins to melt, the pulling mechanism slowly raises the seed crystal 118 up along the pull axis $X_1$ to grow the single crystal ingot 102. The seed crystal 118 may also be rotated about the pull axis $X_1$ by the pulling mechanism as the pulling mechanism raises the seed crystal 118. As the seed crystal 118 is slowly raised from the melt 104 along the pull axis $X_1$, the silicon ingot 102 begins to solidify and to be extracted from the melt 104.

A process gas (e.g., argon) is introduced through a gas inlet port 128 into inner chamber 110 and is withdrawn through an outlet port (not shown) in fluid communication with an exhaust system (not shown) of the ingot puller 100. The process gas creates an inert atmosphere within the housing. The surface of the melt 104 and the inert atmosphere form a melt-gas interface 126. The melt-gas interface 126 is located radially outward from a solid-melt interface 124 along which the ingot 102 is grown. As the description proceeds, the melt-gas interface 126 and the surface of the melt 104 may be used interchangeably.

The ingot 102 is shrouded by an annular heat shield 130 and a cooling jacket 132. The annular heat shield 130 and the cooling jacket 132 are each mounted within the inner chamber 110 above the melt 104. The heat shield 130 is mounted radially outward from the cooling jacket 132, and defines an elongate passage 134 sized and shaped to receive the ingot 102 as the ingot 102 is pulled up from the melt 104 along the pull axis $X_1$. The heat shield 130 is mounted above the melt-gas interface 126 such that a gap 136 is defined therebetween. The cooling jacket 132 is positioned radially inward from the heat shield 130, and within the elongate passage 134. The cooling jacket 132 is concentrically arranged with the heat shield 130 along the pull axis $X_1$, and defines a central passage 140 for receiving the ingot 102 as the ingot 102 is pulled along the pull axis $X_1$ by the pulling system 116. A portion 138 of the passage 134 defined by the heat shield 130 is located below the cooling jacket 132. The heat shield 130 insulates and/or reflects radiant heat away from the ingot 102 as the ingot is pulled through the passage 134. The cooling jacket 132 may be in the form of a cylindrical, fluid-cooled heat exchanger that facilitates cooling of the ingot 102 as the ingot 102 is pulled through the passage 140. The heat shield 130 and the cooling jacket 132 may facilitate controlling axial and radial temperature gradients, which drive solidification and crystallization of molten silicon in the melt 104 into the growing ingot 102. The configuration of the heat shield 130 and the cooling jacket 132 may vary to enhance temperature effects within the passages 134, 140 as the ingot 102 is pulled therethrough.

The ingot puller 100 also includes a gas doping system 200 for introducing gaseous dopant (indicated by arrows 202) into the melt 104. The doping system 200 includes a dopant feed source 204, a feed tube 206, and an evaporation capsule 208. Generally, the gas doping system 200 causes the gaseous dopant 202 to flow across the melt-gas interface 126 during growth of the ingot 102. The gaseous dopant 202 fluxes into the melt 104 through the melt-gas interface 126. Dopant species is then transported, by diffusion and convection, toward the solid-melt interface 124 whereby the ingot 102 is doped to control resistivity variations that occur during growth of the ingot 102.

Figure 2:
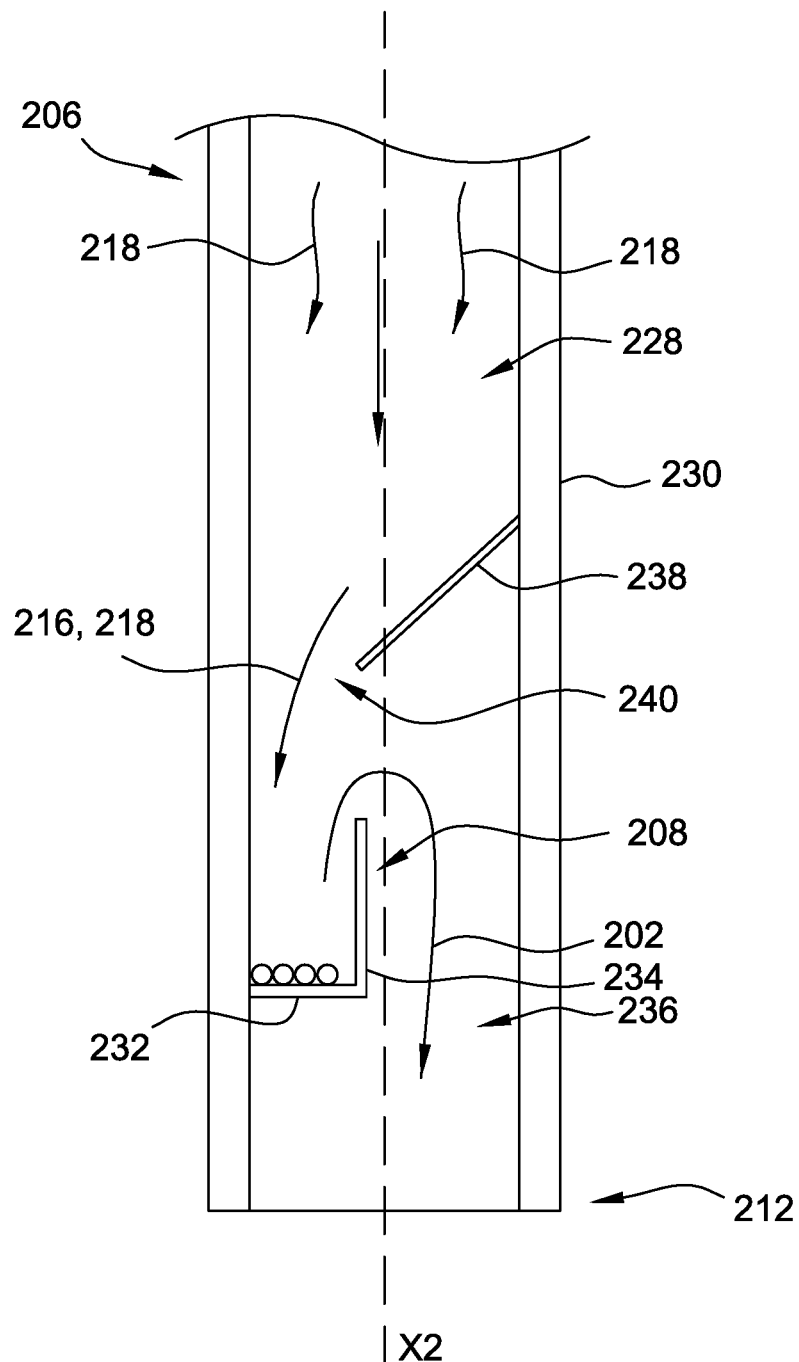
FIG. 2 is an enlarged cross-section of a portion of feed tube of the gas doping system of FIG. 1.

The feed tube 206 extends along a feed tube axis $X_2$ between a first end 210 and a second end 212 (FIG. 2). The first end 210 is located adjacent to the dopant feed source 204, which may be positioned outside of the outer housing 108. The second end 212 is located within the inner chamber 110 and oriented toward the surface of the melt 104. The feed tube 206 may extend through a valve assembly (not shown) that provides an ingress point for the feed tube 206 through the outer housing 108, and seals the ingress point when the feed tube 206 is removed from the ingot puller 100. The feed tube 206 is open at the first end 210 to receive volatile dopant (indicated by arrows 216 shown in FIG. 2) from the dopant feed source 204 and open at the second end 212 to allow gaseous dopant 202 to flow out from the second end 212 of the feed tube 206 toward the surface of the melt 104 and, particularly, toward the melt-gas interface 126.

As shown in FIG. 1, the feed tube 206 may be angled with respect to the pulling axis $X_1$ and the surface of the melt 104 to facilitate the distribution of gaseous dopant 202 across the melt-gas interface 126. For example, the feed tube 206 may be angled such that the feed tube axis $X_2$ forms an angle of between about 10 degrees and about 80 degrees, such as between about 15 degrees and about 45 degrees, relative to the pulling axis $X_1$. The orientation of the feed tube 206 may translate to an orientation of the open end 212. In some embodiments, the open end 212 may be angled with respect to the feed tube axis $X_2$. For example, the open end 212 may be angled relative to the feed tube axis $X_2$ such that an opening formed by the open end 212 is substantially parallel to the melt-gas interface 126. In other embodiments, the feed tube 206 may be positioned substantially perpendicular to the melt-gas interface 126 such that the feed tube axis $X_2$ is parallel to the pulling axis $X_1$. In yet other embodiments, the feed tube 206 and/or open end 212 of the feed tube 206 may have any other suitable configuration or orientation that enables gas doping system 200 to function as described herein.

The doping system 200 may also include an inert gas supply 214 coupled in fluid communication with the feed tube 206 to guide gaseous dopant 202 out from the feed tube 206 through the second end 212 and to reduce back flow of gaseous dopant 202. An inert gas (indicated by arrows 218 shown in FIG. 2) introduced into the feed tube 206 by the inert gas supply 214 and/or the process gas introduced through the gas inlet port 128 may guide the gaseous dopant 202 to flow across the melt-gas interface 126 and flux into the melt 104. The inert gas 218 and/or the process gas introduced through the gas inlet port 128 is also used to produce an inert atmosphere above the melt-gas interface 126. The inert gas 218 may be introduced into the feed tube 206 from the inert gas supply 214 at a suitable flow rate, such that the inert gas 218 flows downwardly towards the second end 212. The inert gas 218 may be argon, although any other suitable inert gas may be used that enables the gas doping system 200 to function as described herein. The flow rate of the inert gas 218 is suitably sufficient to guide the gaseous dopant 202 out from the second end 212 toward the melt-gas interface 126 without substantially causing undesirable dilution of gaseous dopant 202 and/or substantially causing gaseous dopant 202 to flow out from the inner chamber 110 without fluxing into the melt 104. For example, the inert gas flow rate may be less than about 10 normal-liters per minute, less than about 5 normal-liters per minute, or even less than about 2 normal-liters per minute.

The first end 210 of the feed tube 206 is coupled in flow communication with the dopant feed source 204. The dopant feed source 204 feeds a volatile dopant 216, which may be in the form of solid-phase dopant or liquid phase dopant, into the first end 210 of the feed tube 206. As used herein, the term "volatile dopant" generally refers to dopants that have a sublimation or evaporation temperature at or below the melting temperature of silicon (about 1414° C.), such that the volatile dopant 216 may be vaporized into the gaseous dopant 202 under thermal conditions within the inner chamber 110 during a crystal growth process.

The dopant feed source 204 may be automated, partially automated, or manually operated. Automated control of the dopant feed source 204 may be facilitated by a controller 220 communicatively coupled to the dopant feed source 204. The dopant feed source 204 may automatically feed volatile dopant 216 into the feed tube 206 based upon one or more user-defined parameters, and/or environment-specific parameters. For example, the dopant feed source 204 may feed volatile dopant 216 into the feed tube 206 based upon any one or more of the following parameters: preset time(s) during a growth process, user defined interval(s), a targeted resistivity of the ingot 102 during a growth process, a mass of the volatile dopant 216 within the feed tube 206 and/or evaporation capsule 208, a concentration of the gaseous dopant 202 within the feed tube 206, the evaporation capsule 208, and/or the inner chamber 110, a vaporization rate of the volatile dopant 216, and a volumetric or mass flow rate of the gaseous dopant 202 and/or the inert gas 218. The continuous and/or intermittent feeding of the volatile dopant 216 may facilitate a relatively constant gaseous dopant concentration to be maintained within the inner chamber 110, and in the melt 104, during the crystal growth process, resulting in a more uniform dopant concentration profile in grown ingots.

The controller 220 may be programmed to control the frequency and/or amount of volatile dopant 216 being fed into the feed tube 206 by the dopant feed source 204. The controller 220 includes a processor 222 that sends and receives signals to and from the controller 220 and/or the dopant feed source 204 based on one or more user-defined parameters and/or environment-specific parameters. The controller 220 also includes a user interface 224 communicatively coupled to the processor 222, and a sensor 226 communicatively coupled to the processor 222. The user interface 224 receives user-defined parameters, and communicates user-defined parameters to the processor 222 and/or the controller 220. The sensor 226 receives and/or measures environment-specific parameters, and communicates such environment-specific parameters to the processor 222 and/or the controller 220. For example, the sensor 226 may be a pyrometer that measures a temperature of the melt 104 and/or a temperature of the growing ingot 102. The environment-specific parameters communicated by the sensor 226 may be used by the processor 222 and/or the controller to cause dopant feed source 204 to feed volatile dopant 216 to the feed tube 206.

The evaporation capsule 208 is disposed within the feed tube 206 proximate the second end 212, and within the inner chamber 110. With additional reference to FIG. 2, the volatile dopant 216 fed to the feed tube 206 flows downward through a channel 228 defined by an annular sidewall 230 of the feed tube 206 and is received by the evaporation capsule 208 which forms a receptacle within the feed tube proximate the second end 212. The evaporation capsule 208 includes a base 232 extending inward from the sidewall 230, and a capsule sidewall 234 joined to the base 232 and extending upwardly from the base 232 along the feed tube axis $X_2$. In other embodiments, the evaporation capsule 208 may have any other suitable configuration that enables gas doping system 200 to function as described herein. For example, in some embodiments, the capsule 208 may be removably connected to the tube to allow the capsule to be separated from the tube for loading of dopant.

A portion 236 of the channel 228 through which the gaseous dopant 202 flows is partially defined by the capsule sidewall 234 and the feed tube sidewall 230. The portion 236 of the channel 228 facilitates fluid communication between the evaporation capsule 208 and the open end 212 of the feed tube 206. Thereby, gaseous dopant 202 that is formed by vaporizing volatile dopant 216 received by the evaporation capsule 208 is enabled to flow from the evaporation capsule 208 to the second end 212 and out from the feed tube 206. The cross-sectional area of portion 236 of the channel 228, viewed perpendicular to the feed tube axis $X_2$, may be adjusted in order to increase or decrease the flow rate of gaseous dopant 202 passing therethrough. For example, the cross-sectional area of the portion 236 of the channel 228 may be decreased by extending the length of the base 232 of the evaporation capsule 208. Similarly, the length of the portion 236 of the channel 228 may be increased or decreased by varying the height of capsule sidewall 234.

The feed tube 206 may also include a guide 238 disposed in the channel 228 above the evaporation capsule 208 for facilitating flow of the volatile dopant 216 into the evaporation capsule 208. The guide 238 may also act as a fluid flow restrictor, permitting the passage of the volatile dopant 216 therethrough, and also restricting backflow of the gaseous dopant 202 therethrough. Alternatively stated, the guide 238 may act as a one-way valve for dopants supplied to the inner chamber 110 via the gas doping system 200.

The guide 238 may be conically shaped and extends inwardly from the feed tube sidewall 230 and downwardly towards the second end 212. In alternative embodiments, guide 238 may have any suitable configuration that enables the gas doping system 200 to function as described herein. The guide 238 funnels the volatile dopant 216 through the opening 240 and into the evaporation receptacle. As the volatile dopant 216 is vaporized in the evaporation capsule 208, the guide 238 diverts gaseous dopant 202 flowing upwards away from the opening 240, thereby limiting back flow of the gaseous dopant 202. Additionally, the guide 238 directs the inert gas 218 through the opening 240 (which has a smaller diameter than the channel 228), creating a localized high pressure area of the inert gas 218 near the opening 240, thereby restricting back flow of the gaseous dopant 202 therethrough.

The feed tube 206 may also include a fluid-distribution plate (not shown) that facilitates distributing the gaseous dopant 202 across the melt-gas interface 126. The fluid-distribution plate may be coupled to the feed tube 206 at the second end 212. The fluid-distribution plate may have a hemi-spherical, conical, rectangular, or square shape, or any other suitable shape that enables gas doping system 200 to function as described herein.

The evaporation capsule 208 and the feed tube 206, as well as the guide 238 and the fluid-distribution plate (when included), may be made of any suitable material that enables gas doping system 200 to function as described herein. In some embodiments, these components are each suitably made from fused quartz (e.g., a single piece of fused quartz). In yet other embodiments, the evaporation capsule 208 and the feed tube 206, as well as the guide 238 and the fluid-distribution plate may be fabricated as separate components. Integrating the evaporation capsule 208 within the feed tube 206 may provide a relatively simple construction of the gas doping system 200, and may reduce the overall size of the gas doping system 200. As a result, positioning the feed tube 206 and the evaporation capsule 208 within the furnace using a positioning system, such as positioning system 242, is simplified.

The feed tube 206 is slidingly coupled to a positioning system 242 that raises and/or lowers feed tube 206 along the feed tube axis $X_2$. The positioning system 242 includes a rail 244, a coupling member 246, and a motor (e.g., a step motor) (not shown). The coupling member 246 slidingly couples the feed tube 206 to the rail 244. The motor moves the coupling member 246 and the feed tube 206 along the rail 244. The rail 244 extends in a direction substantially parallel to the feed tube axis $X_2$. Using the positioning system 242, the second end 212 of the feed tube 206 and the evaporation capsule 208 is raised and lowered into and out of the inner chamber 110. Additionally, the positioning system 242 facilitates adjusting a height H of the second end 212 above the melt-gas interface 126.

The positioning system 242 is communicatively coupled to the controller 220. The controller 220 may be programmed to control the positioning system 242 to dynamically adjust the height H of the second end 212 of the feed tube 206 above the melt-gas interface 126 during a crystal growth process as well as the speed at which the feed tube 206 moves along the rail 244 to adjust the height H of the second end 212. For example, the processor 222 may send and receive signals to and from the controller 220 and/or the positioning system 242 based on one or more user-defined parameters and/or environment-specific parameters. The user-defined parameters for controlling the positioning system 242 may be received by the user interface 224 which communicates the user-defined parameters to the processor 222 and/or the controller 220. As described above, the sensor 226 receives and/or measures environment-specific parameters, and communicates such environment-specific parameters to the processor 222 and/or the controller 220. The user-defined parameters and the environment-specific parameters may be used by the processor 222 and/or the controller 220 to cause the positioning system 242 to adjust the height H of the second end 212 of the feed tube 206 and/or control the speed at which the height H of the second end 212 changes by movement of the feed tube 206 along the rail 244.

In operation, the Czochralski method (batch or continuous) begins by loading polycrystalline silicon (or "polysilicon") into the crucible 106. The solid polysilicon added to the crucible 106 is typically granular polysilicon, although chunk polysilicon may be used, and it is fed into the crucible 106 using a polysilicon feeder (not shown) that is optimized for use with granular polysilicon. Chunk polysilicon typically has a size of between 3 and 45 millimeters (e.g., the largest dimension), and granular polysilicon typically has a size between 400 and 1400 microns. Granular polysilicon has several advantages including providing for easy and precise control of the feed rate due to the smaller size. However, the cost of granular polysilicon is typically higher than that of chunk polysilicon due to the chemical vapor deposition process or other manufacturing methods used in its production. Chunk polysilicon has the advantage of being cheaper and being capable of a higher feed rate given its larger size.

Generally, the melt 104 from which the ingot 102 is drawn is formed by loading the polycrystalline silicon into the crucible 106 to form an initial silicon charge. In general, an initial charge is between about 100 kilograms and about 1000 kilograms of polycrystalline silicon, which may be granular, chunk, or a combination of granular and chunk. The mass of the initial charges depends on the desired crystal diameter and configuration of the ingot puller 100. In some embodiments, the initial polycrystalline silicon charge is sufficient to grow one single crystal silicon ingot, i.e., in a batch Czochralski method. In general, the total axial length (measured in a direction of the pulling axis $X_1$) of the solid main body of the single crystal silicon ingot 102 is at least about 1100 millimeters (mm). In a continuous Czochralski method, the initial charge does not reflect the length of crystal, because polycrystalline silicon is continuously fed during crystal growth. Accordingly, the initial charge may be smaller, such as between about 100 kg and about 200 kg. If polycrystalline silicon is fed continuously and the height of the inner chamber 110 is sufficiently tall, axial length of the ingot 102 may be extended in length, such as to 4000 mm. A variety of sources of polycrystalline silicon may be used including, for example, granular polycrystalline silicon produced by thermal decomposition of silane or a halosilane in a fluidized bed reactor or polycrystalline silicon produced in a Siemens reactor. Once polycrystalline silicon is added to the crucible to form a charge, the charge is heated to a temperature above about the melting temperature of silicon (e.g., about 1414° C.) to melt the charge, and thereby form the silicon melt 104 comprising molten silicon. The silicon melt 104 has an initial volume of molten silicon and has an initial melt elevation level, and these parameters are determined by the size of the initial charge. In some embodiments, the crucible 106 containing the silicon melt is heated to a temperature of at least about 1425° C., at least about 1450° C. or even at least about 1500° C. The initial polycrystalline silicon charge is heated by supplying power to the heaters 114.

Once the solid polycrystalline silicon charge is liquefied to form the silicon melt 104, the seed crystal 118 is lowered to contact the melt 104. The seed crystal 118 is then withdrawn from the melt 104 with silicon being attached thereto to thereby forming the solid-melt interface 124 near or at the surface of the melt 104. Generally, the initial pull speed of the seed crystal 118 is high to form a neck portion of the ingot having a relatively smaller diameter relative to a diameter of a main body of the ingot 102 subsequently grown. In some embodiments, the seed crystal 118 is withdrawn at a neck portion pull rate of at least about 1.0 mm/minute, such as between about 1.5 mm/minute and about 6 mm/minute. In some embodiments, the seed crystal 118 and the crucible 106 are rotated in opposite directions, i.e., counter-rotation. Counter-rotation achieves convection in the silicon melt 104. Rotation of the seed crystal 118 is mainly used to provide a symmetric temperature profile, suppress angular variation of impurities and also to control a shape of the solid-melt interface 124. In some embodiments, the seed crystal 118 is rotated at a rate of between about 5 rpm and about 30 rpm. In some embodiments, the seed crystal rotation rate may change during growth of the main body of the single crystal silicon ingot 102. In some embodiments, the crucible 106 is rotated at a rate between about 0.5 rpm and about 10 rpm. In some embodiments, the seed crystal 118 is rotated at a faster rate than the crucible 106. In general, the neck portion has a length between about 300 millimeters and about 700 millimeters, and the length of the neck portion may vary outside these ranges.

After formation of the neck, an outwardly flaring seed-cone portion of the ingot 102 adjacent the neck is grown. In general, the pull rate of the seed crystal 118 is decreased from the neck portion pull rate to a rate suitable for growing the outwardly flaring seed-cone portion. For example, the seed-cone pull rate during growth of the outwardly flaring seed-cone is between about 0.5 mm/min and about 2.0 mm/min. In some embodiments, the outwardly flaring seed-cone has a length between about 100 millimeters and about 400 millimeters. The length of the outwardly flaring seed-cone may vary outside these ranges. In some embodiments, the outwardly flaring seed-cone is grown to a terminal diameter of between about 150 millimeters to about 450 mm. The terminal diameter of the outwardly flaring seed-cone is generally equivalent to the diameter of the constant diameter of the main ingot body of the single crystal silicon ingot 102.

After formation of the neck and the outwardly flaring seed-cone adjacent the neck portion, the main ingot body of the ingot 102 having a constant diameter adjacent the outwardly flaring seed-cone is grown. The constant diameter portion of the main ingot body has a circumferential edge, a central axis that is parallel to the circumferential edge and the pulling axis $X_1$, and a radius that extends from the central axis to the circumferential edge. The central axis also passes through the cone portion and neck. The diameter of the main ingot body may vary and, in some embodiments, the diameter may be about 150 mm, at least about 150 mm, about 200 mm, at least about 200 millimeters, about 300 mm, at least about 300 mm, about 450 mm, or even at least about 450 mm. Alternatively stated, the radial length of the solid main ingot body of the single crystal silicon ingot 102 is about 75 mm, at least about 75 millimeters, about 100 mm, at least about 100 millimeters, about 150 mm, at least about 150 mm, about 225 mm, or even at least about 225 mm. The main ingot body of the single crystal silicon ingot 102 is eventually grown to an axial length (measured along the pulling axis $X_1$) at least about 1000 mm, such as at least 1200 mm, such as at least 1250 mm, such as at least 1400 mm, such as at least 1500 mm, or at least 2000 mm, or at least 2200 mm, such as 2200 mm, or at least about 3000 mm, or at least about 4000 mm. In some preferred embodiments, the total axial length of the solid main ingot body of the single crystal silicon ingot 102 is at least about 1100 mm, such as between about 1200 mm and about 1300 mm, such as between about 1200 mm and about 1250 mm.

In a continuous Czochralski method, during growth of the main ingot body of the single crystal silicon ingot 102, polycrystalline silicon, i.e., granular, chunk, or a combination of granular and chunk, is added to the melt 104 to thereby achieve a constant volume of molten silicon in the melt 104 and constant melt elevation level. Maintenance of a substantially constant melt volume during growth of a substantial portion of the axial length of the main body of the single crystal silicon ingot 102 enables the achievement of high ingot quality over a substantial portion of the axial length of the main body of the single crystal silicon ingot 102 at a constant pull rate. The constant melt volume regardless of the crystal length enables maintaining a constant solid-melt interface 124 and thus uniform crystal quality over a substantial portion of the main body of the ingot 102. Accordingly, in some embodiments, the volume of melt 104 varies by no more than about 1.0 volume % during growth of at least about 90% the main body of the single crystal silicon ingot 102, or by no more than about 0.5 volume % during growth of at least about 90% the main body of the single crystal silicon ingot 102, or even by no more than about 0.1 volume % during growth of at least about 90% the main body of the single crystal silicon ingot 102. Alternatively stated, in some embodiments, the melt elevation level varies by less than about +/−0.5 millimeter during growth of at least about 90% the main body of the single crystal silicon ingot 102.

In a batch Czochralski method, the initial charge of polycrystalline silicon is sufficient to grow the entire length of the ingot 102. Rather than maintain a constant melt elevation level, the volume of the melt 104 is depleted as the ingot 102 grows. In some embodiments, growth of the ingot 102 by a batch Czochralski method may necessitate the vertical movement of the crucible 106 in the same direction in which the ingot is pulled, that is, along the pulling axis $X_1$.

During growth of the ingot 102, the gaseous dopant 202 is introduced into the melt 104 using the gas doping system 200 to modify and/or control a base resistivity of the ingot 102. Suitably, the gas doping process may be initiated once a predetermined axial length of the main body of the ingot 102 has been grown. In batch Czochralski growth processes, for example, significant resistivity variations in the main body of the ingot 102 and/or a type-change of the ingot 102 may occur as the melt 104 is depleted during growth of a single ingot 102. As the melt 104 is depleted, dopants (e.g., n-type dopants such as arsenic or phosphorus) that were previously introduced into the melt 104 and have low segregation coefficients accumulate in the melt 104 altering the resistivity of the growing ingot 102. Accordingly, the gas doping process may be initiated to dope or counter-dope the ingot 102 with the gaseous dopants 202 suitable to modify and/or control resistivity variations in later stages of the growth process. The time at which the gas doping process is initiated may be controlled manually or automatically controlled by controller 220 based on user-defined parameters or environment-specific parameters. In some instances, the gas doping process is initiated at a suitable time based on empirical data and a predicted resistivity drop once a certain axial length of the main body of the ingot 102 has been grown.

To initiate the doping process, an initial charge of solid-phase or liquid-phase volatile dopant 216, such as volatile p-type dopants (e.g., boron), or volatile n-type dopants (e.g., arsenic, phosphorous), or any other element or compound with a suitably low sublimation or evaporation temperature that enables the gas doping system 200 to function as described herein, is introduced into the feed tube 206 from the dopant feed source 204. The amount and type of the initial charge of volatile dopant 216 is selected to achieved targeted modification of the base resistivity of the ingot 102. Solid dopant falls downwardly through the channel 228 of the feed tube 206, and is funneled by the guide 238 to pass through the opening 240 and into the evaporation capsule 208.

At this stage, the second end 212 of the feed tube 206 may be at an initial height (not shown in FIG. 1) above the melt-gas interface 126. The initial height may also be referred to herein as a first height. In order to vaporize the volatile dopant 216, heat is supplied to the evaporation capsule 208. In the example shown in FIG. 1, heat is supplied to the evaporation capsule 208 in the form of radiant heat from the melt 104 and the heat source 112 which may include the heaters 114. When the second end 212 of the feed tube 206 is at the initial height above the melt-gas interface 126, the evaporation capsule 208 that is positioned proximate the second end 212 may not receive sufficient radiant heat from the melt 104 and the heat source 112 to increase a temperature of the evaporation capsule 208 to a temperature sufficient to vaporize the volatile dopant 202. The positioning system 242 is used to lower the feed tube 206 along the feed tube axis $X_2$ so that the second end 212 is located at the height H (shown in FIG. 1) above the melt-gas interface 126. When the second end 212 is at the height H, the evaporation capsule 208 is positioned sufficiently near the melt 104 such that radiant heat from melt 104 and the heaters 114 is sufficient to vaporize the volatile dopant 216 within the evaporation capsule 208 into the gaseous dopant 202. For example, the height H may be about 1 centimeter and about 15 centimeters above melt-gas interface 126. In other embodiments, a separate heating element (not shown) may be used to supply heat to the evaporation capsule 208 to vaporize the volatile dopant 216 therein into the gaseous dopant 202.

As shown in FIG. 1, the second end 212 at the height H may be located in the portion 138 of the passage 134 defined by the heat shield 130 that is located below the cooling jacket 132. Alternatively, the second end 212 at the height H may be located in the gap 136 defined between the melt-gas interface 126 and the heat shield 130. Movement of the feed tube 206 to position the second end 212 at the height H may require the feed tube 206 to pass through the heat shield 130. The heat shield 130 may include a conduit (not shown) formed therein sized and shaped to receive the feed tube 206 and allow movement of the feed tube 206 therethrough.

The gaseous dopant 202 formed by heating the initial charge of volatile dopant 216 in the evaporation capsule 208 subsequently flows out from the second end 212 and toward the melt-gas interface 126. The gaseous dopant 202 contacts the surface of the melt 104 at the melt-gas interface 126 and fluxes into the melt 104. Dopant species introduced in the melt 104 are transported, by diffusion and convection, toward the solid-melt interface 124 and are taken up by the growing ingot 102.

Doping the melt 104 with the gaseous dopant 202 may present several challenges to producing the growing ingot 102 with targeted resistivity. Initially, a target dopant concentration in the melt 104 to achieve a targeted resistivity of the ingot 102 must be determined. The target dopant concentration is determined based on numerous transport mechanisms that affect the amount of dopant in the melt 104 that is taken up by the ingot 102, including, for example, convective mass transport, diffusion resulting from dopant concentration gradients, and dopant segregation from the ingot 102. Also, in the case of continuous Czochralski growth processes, additional dopant and melt material added to the melt 104 throughout the growth process affect the dopant concentration in the ingot 102.

Figure 3:
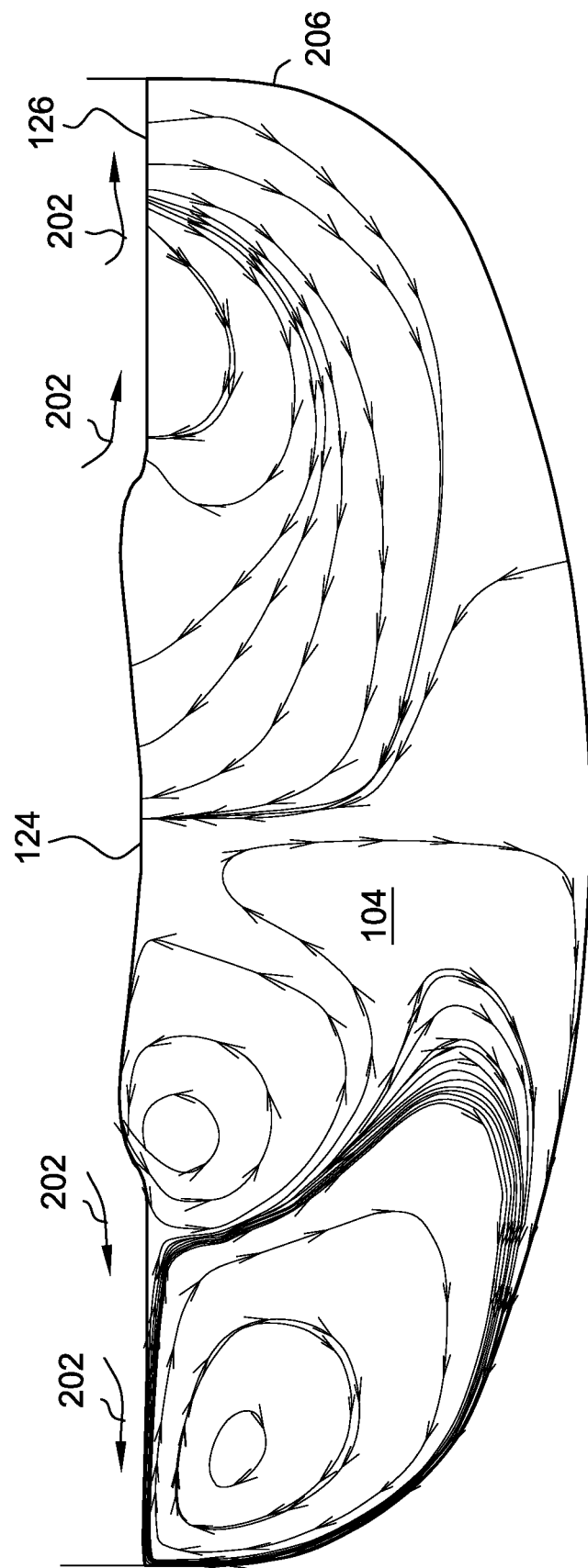
FIG. 3 shows simulated convective flow (left) and diffusion (right) patterns of dopant species in a silicon melt during a crystal growth process.

These transport mechanisms may be simulated to study thermal heat flow and dopant concentration distribution to estimate the path of dopant species through the melt 104 from the melt-gas interface 126 to the solid-melt interface 124. A study of the transport mechanisms may be used to control variations in the dopant concentration at the solid-melt interface 124, which may otherwise cause non-uniform axial and radial resistivity profiles of the growing ingot 102. For example, FIG. 3 illustrates melt convection patterns (left) and dopant diffusion patterns (right) in the melt 104, depicted by arrows in FIG. 3 indicating the direction of dopant transport. In the example shown, the melt convection pattern includes two vortexes and the average melt velocity is around 2 mm/second. From a point where the gaseous dopant 202 fluxes into the melt 104, dopant species may need more than 16 minutes to reach the solid-melt interface 124. These transport patterns are shown for example only. The transport mechanisms depend upon the environmental conditions and operating parameters within the ingot puller 100, including, for example, a pull rate of the seed crystal 118, a pressure within the inner chamber 110, a rotation rate of the crucible 106, a rotation rate of the seed crystal 118, a gas flow rate across the surface of the melt 104, and a size of the gap 136 between the heat shield 130 and the melt-gas interface 126. Transport characteristics, such as the diffusion coefficients for various volatile dopants 216, may be empirically determined for a specific configuration of the ingot puller 100 and growth process based on one more Czochralski growth procedures performed using the ingot puller 100 and used to generate simulations such as the one shown in FIG. 3 to study transport mechanisms. For example, in the case of boron dopant species, a boron dopant diffusion coefficient in the silicon melt 104 may be $6 \times 10^{-5}$ kg/m/s.

A shape of the solid-melt interface 124 may also be controlled by adjusting the above-described parameters, and the shape of the solid-melt interface 124 may affect axial and radial resistivity gradients of the growing ingot 102. As shown in FIG. 3, the solid-melt interface 124 has an M-curve shape, and the center of the concave portion of the solid-melt interface 124 extends about 8.5 mm into the melt 104. The ingot 102 will solidify from the crystal edge at the intersection of the solid-melt interface 124 and the melt-gas interface 126. When the dopant species enter the melt 104 and are transported to the solid-melt interface 124, the resistivity of the ingot 102 will be modified starting at the crystal edge.

By simulating the transport mechanisms of the dopant species within the melt 104, the dopant concentration at the solid-melt interface 124 may be estimated based on a concentration of dopant species that flux into the melt from the gaseous dopant 202. The concentration of dopant taken up by the crystal ingot 102 may be determined from the dopant concentration in the melt by considering the segregation coefficient and the solidification ratio of the dopant. In batch Czochralski growth processes, the following equation may be used:

$$C_C(\eta) = C_{C,0}(1-\eta)^{k_i - 1} \qquad \text{Eq. 1}$$

where $C_c$ represents the dopant concentration in the crystal ingot, $k_i$ represents the effective segregation coefficient of the dopant (which may be known or empirically determined), η represents the fraction of the ingot 102 grown, and $C_{c,0}$ represents the dopant concentration of the melt 104 from which the crystal ingot is grown. The resistivity of the crystal ingot 102 may be determined based on the dopant concentration in the ingot 102 using standard conversion tables and/or formulas known in the art, such as standards SEMI MF723-0307 and SEMI F723-99, published by SEMI International Standards, which are incorporated herein by reference for all relevant and consistent purposes.

Figure 4:
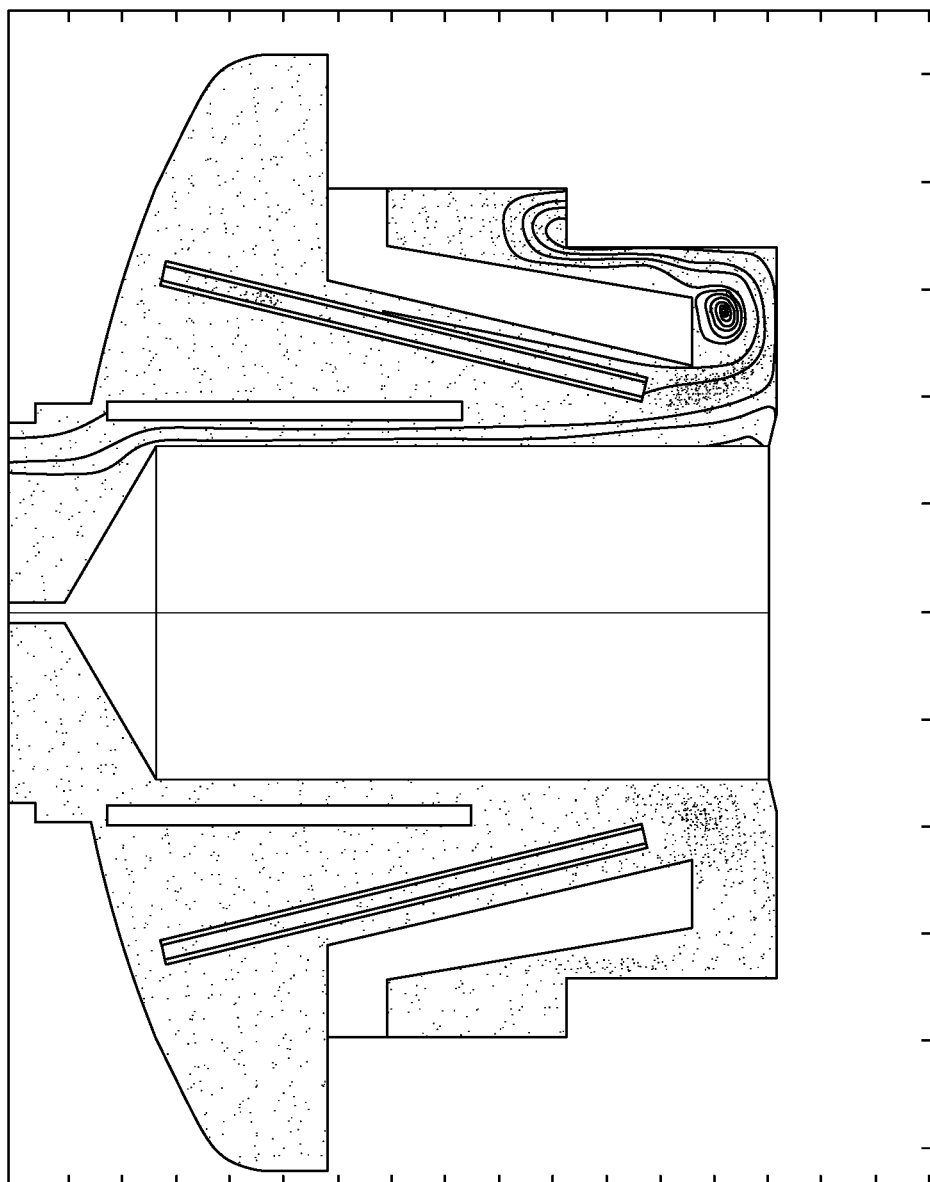
FIG. 4 shows simulated profiles of velocity distribution (left) and gaseous dopant concentration (right) within an inner chamber of the ingot pulling apparatus.

Accordingly, the above simulations and calculations may be used to predict resistivity, and axial and radial resistivity gradients, in an ingot 102 pulled from the melt 104 over the course of a Czochralski growth process. These may be used as a basis to set a targeted amount of dopant concentration in the melt 104 at various stages of the growth process. However, the use of gaseous dopant 202 presents an additional challenge of controlling the amount of dopant added to the melt 104 to meet the targeted dopant concentration and, consequently, to control the axial and radial resistivity profile of an ingot grown from the melt 104. In addition to the above-described parameters related to transport of dopant species within the melt 104, numerous factors affect the doping efficiency of the volatile dopant 216 contained in the evaporation capsule 208. The "doping efficiency" refers to the amount of dopant species that are taken up by the growing ingot 102 versus the amount of volatile dopant 216 added to the feed tube 206 in a single charge. For example, the gas transport characteristics of the gaseous dopant 202 that travels to the melt-gas interface 126 from the second end 212 of the feed tube 206 affect the amount of gaseous dopant 202 that fluxes into the melt 104. The path of the gaseous dopant 202 is guided by diffusion of the gaseous dopant 202 and force convection by the inert gas 218 and/or the process gas supplied by the gas inlet port 128. Similar to the dopant species transport in the melt 104 (shown in FIG. 3), gas transport of the gaseous dopant 202 toward the melt-gas interface 126 may be simulated as shown in FIG. 4. Specifically, FIG. 4 shows simulated profiles of velocity distribution (left) and gaseous dopant 202 concentration (right) within the inner chamber 110 of the ingot puller 100.

In addition, the amount of gaseous dopant 202 produced depends on both the amount of volatile dopant 216 fed to the evaporation capsule 208, as well as the thermal conditions used to vaporize the volatile dopant 216 in the evaporation capsule 208. As discussed above, the evaporation capsule 208 must reach a suitable temperature in order to vaporize the volatile dopant 216 and form a suitable amount of the gaseous dopant 202 that may flow to the melt-gas interface 126. Otherwise, volatile dopant 216 remains in the evaporation capsule 208 and is not introduced into the melt 104 as the gaseous dopant 202. The temperature conditions necessary to vaporize the volatile dopant 216 depend on phase changes that the volatile dopant 216 undergoes and the temperatures at which these changes occur. For example, in examples where solid boric acid powder is fed to the evaporation capsule 208 to introduce boron as dopant species in the melt 104, the following phase changes and reactions occur:

1. $H_3BO_3(s) \rightarrow HBO_3(s) + H_2O(g)$, T>170° C. (443K);
2. $4HBO_2(s) \rightarrow H_2B_4O_7(l) + H_2O(g)$, T>300° C. (573K);
3. $H_2B_4O_7(l) \rightarrow 2B_2O_3(l) + H_2O(g)$, T>330° C. (600K);
4. $B_2O_3(l) \rightarrow B_2O_3(g)$, T>510° C. (783K).

See High-Temperature Vaporization of $B_2O_3(l)$ under Reducing Conditions, J. Phys. Chem. B 2011, 115, 45, 13253-13260. Temperatures within the inner chamber near the melt 104 may reach 1200K to 1400K. Thus, at the working temperatures experienced by the capsule 208 when the second end 212 is at the height H causes congruent vaporization of $B_2O_3$ (l) according to the equilibrium state.

The phase change and reaction characteristics of the volatile dopant 216 may be used to set targeted temperatures of the evaporation capsule 208 so that sufficient vaporization of the volatile dopant 216 occurs.

As discussed above, heat supplied to the evaporation capsule 208 depends on the height of the second end 212 of the feed tube 206 above the melt-gas interface 126. Vaporization of the volatile dopant 216 to produce the gaseous dopant 202 may thereby be controlled by controlling the height H of the second end 212, as well as the speed at which the positioning system 242 lowers the feed tube 206 to move the second end 212 from the initial height to the height H (which may also be referred to as the second height H). Specifically, the speed at which the second end 212 is moved from the initial height to the second height H controls the rate of temperature increase of the evaporation capsule 208, which in turn controls the vaporization rate of the volatile dopant 216. Thus, by controlling the height H and the speed at which the second end 212 moves from the initial height to the height H, the amount of gaseous dopant 202 that fluxes into the melt 104 may be controlled, taking into account the above-described considerations related to gas transport characteristics.

Figure 5:
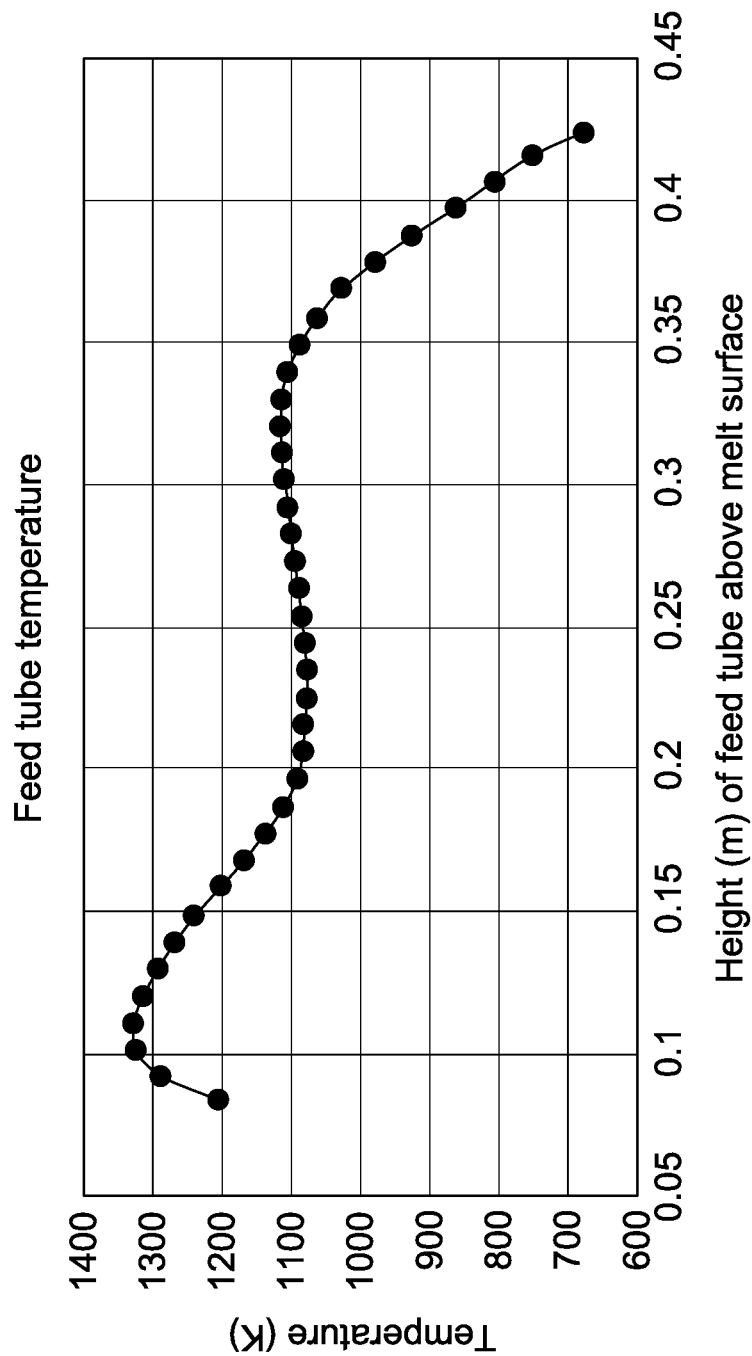
FIG. 5 is a plot showing the estimated temperature profile of a second end of the feed tube relative to a height above a melt-gas interface during a crystal growth process.

An additional challenge, however, is that the vaporization rate of the volatile dopant 216 and the temperature of the evaporation capsule 208 are difficult to measure directly during a crystal growth process. For example, temperature sensors that measure the temperature of the evaporation capsule 208 during a growth process may undesirably impact or influence the gas dopant process and, accordingly, may not be used. It is difficult, therefore, to determine a suitable height H and movement speed of the feed tube 206 to achieve targeted vaporization of the volatile dopant 216 and, in turn, targeted dopant concentration in the melt 104. A temperature profile of the second end 212 of the feed tube 206 vs. height above the melt-gas interface 126 may be generated by two or more thermal simulations with the height H being varied during the thermal simulations (see FIG. 5). Based on the simulated temperature profile, a targeted height H of the second end 212 may be set. The thermal simulations were performed using commercially available tools and other software codes that model the heat transmission in a puller (e.g., ingot puller 100) during the growth of a crystal ingot (e.g., ingot 102). The temperature of the second end 212 may also be measured experimentally by use of temperature sensors (e.g., sensor 226) during sample runs of the puller.

Figure 6:
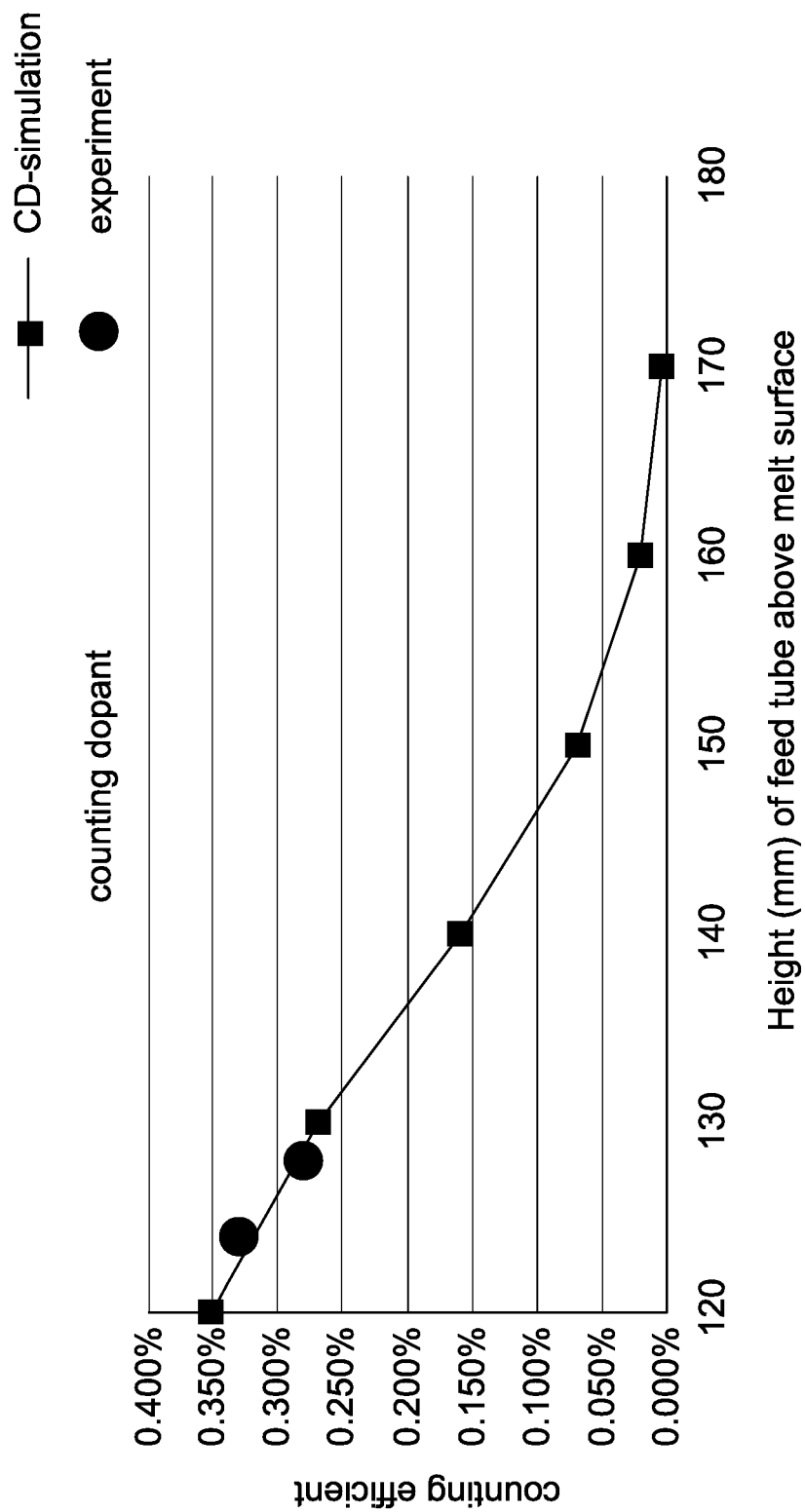
FIG. 6 is a plot showing the doping efficiency relative to the height of the feed tube above the melt-gas interface during a crystal growth process.

In addition to the simulated temperature profile, a doping efficiency of the volatile dopant 216 may be estimated based on the height H and used to control the height H of the second end 212 of feed tube as well as the speed at which the second end 212 moves from the initial height to the height H. The doping efficiency is the ratio of the amount of volatile dopant 216 fed to the evaporation capsule 208 to the amount of dopant species taken up in the ingot 102. A doping efficiency profile (shown in FIG. 6) may be generated based on simulation or experimentally. To determine the doping efficiency experimentally, test runs may be performed, and a resistivity of the resulting ingot 102 may be measured against an amount of volatile dopant 216 added. As shown in FIG. 6, the doping efficiency increases as the height H decreases. The doping efficiency influences the amount of volatile dopant 216 charged to obtain a targeted resistivity in the ingot 102. The doping efficiency remains below 1% even at the higher range of doping efficiencies (0.3%-0.35%). This may indicate that longer hold times of the second end 212 of feed tube 206 at the height H should be used. The low doping efficiencies may be due to a significant portion of the volatile material 216 remaining in the capsule 208, or being carried out with the process gas and/or inert gas 218 through the exhaust of the puller 100.

Figure 7:
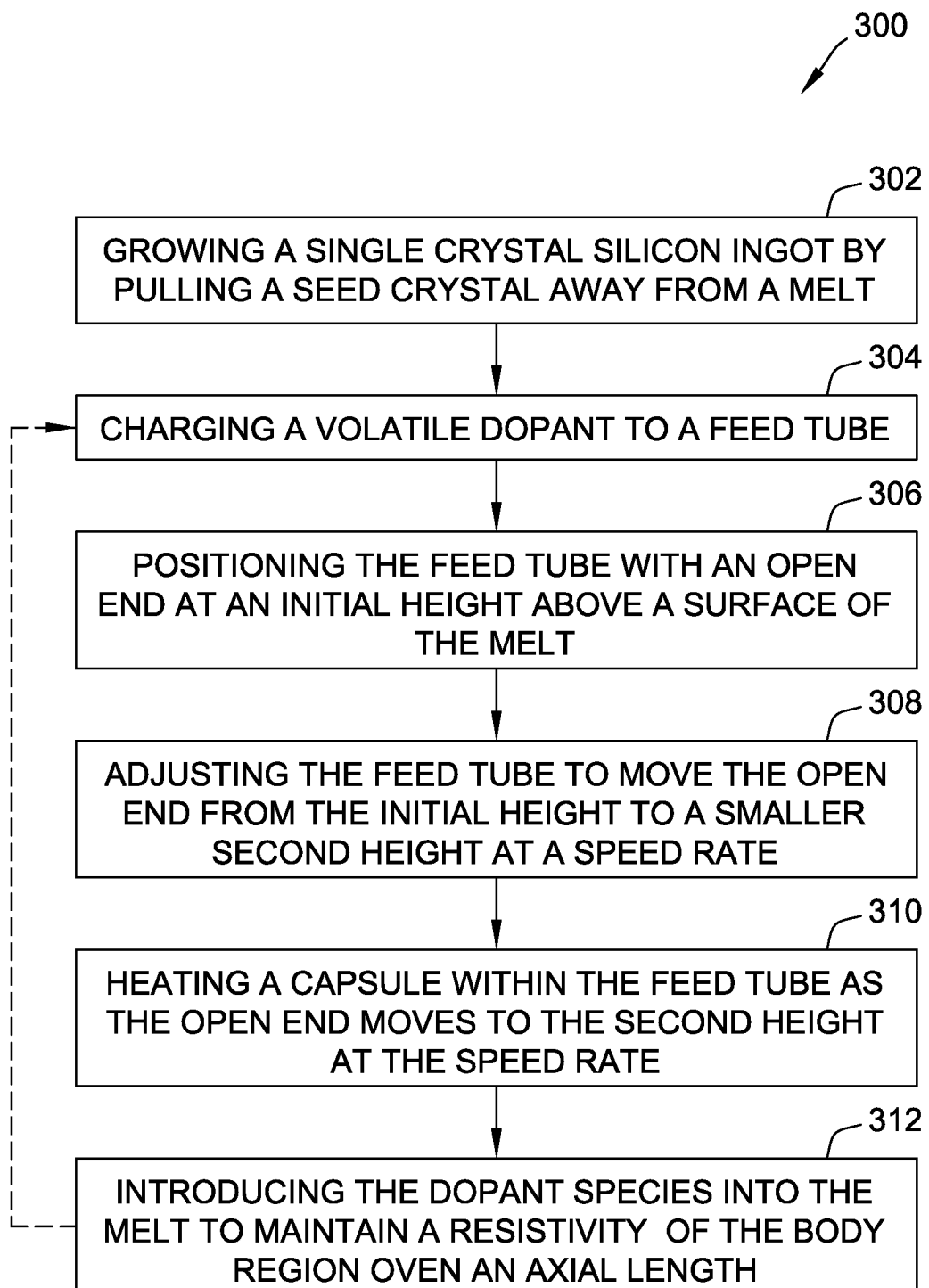
FIG. 7 shows an example method of growing a doped single crystal silicon ingot.

Referring to FIG. 7, an example method 300 of growing a doped single crystal silicon ingot (e.g., ingot 102) using an ingot pulling apparatus (e.g., ingot puller 100) and a gas doping system (e.g., gas doping system 200) is shown. In a first step 302, the single crystal silicon ingot 102 is grown by contacting the silicon melt 104 with the seed crystal 118 and pulling the seed crystal 118 away from the melt 104 at pull rates sufficient to grow the ingot 102 having a neck region, an outwardly flaring seed-cone or shoulder region adjacent the neck region, and a main body region adjacent the shoulder region. The melt 104 is prepared by adding polycrystalline silicon to the crucible 106 and heating, by the heaters 114, the crucible 106 to form the melt 104.

The single crystal silicon ingot 102 grown in the first step 302 may suitably be a low resistivity ingot. That is, the ingot 102, a segment of the ingot (e.g., the neck region, the outwardly flaring seed-cone, and/or the main body region), and/or any single crystal silicon wafer sliced from the ingot 102 has a relatively low minimum bulk resistivity, such as below about 200 ohm-cm, below about 150 ohm-cm, below about 100 ohm-cm, below about 50 ohm-cm, below about 20 ohm-cm, below about 1 ohm-cm, below about 0.1 ohm-cm, or even below about 0.01 ohm-cm. In some embodiments, the ingot, segment, or any single crystal silicon wafer sliced therefrom has a relatively low minimum bulk resistivity, such as below about 200 ohm-cm, or between about 0.01 ohm-cm and about 200 ohm-cm, such as between about 1 ohm-cm and about 200 ohm-cm, between about 20 ohm-cm and about 200 ohm-cm, between about 40 ohm-cm and about 100 ohm-cm, or between about 60 ohm-cm and about 80 ohm-cm. Low resistivity ingots and wafers sliced therefrom may include electrically active dopants, such as p-type dopants such as boron, aluminum, gallium and indium and/or n-type dopants such as phosphorous, arsenic and antimony.

At a second step 304, during growth of the ingot 102 in the first step 302, a charge of volatile dopant 216 is added into the feed tube 206 and is received by the evaporation capsule 208 disposed within the feed tube 206 proximate the second end 212. The charge of volatile dopant 216 is added into the feed tube 206 by the dopant feed source 204. The amount of volatile dopant 216 added in the first step 302 is selected to achieve suitable modification of a base resistivity of the ingot 102 being grown. The charge amount added by the feed source 204 may be automatically controlled by the controller 220, or may be manually controlled. Before, during, and/or after adding a charge of volatile dopant 216 into the capsule 208 at the first step 302, the feed tube 206 is positioned, at step 306, within the inner chamber 110 of the ingot puller 100 such that the open second end 212 of the feed tube 206 has an initial height relative to a surface of the melt 104. The initial height is a suitable distance from the melt 104 so that radiant heat does not substantially cause the capsule 208 to increase to a vaporizing temperature of the volatile dopant 216. The positioning system 242 is used to position the feed tube 206 at the appropriate initial height, which may be automatically controlled by the controller 220, or may be manually controlled.

At step 308, the feed tube 206 is adjusted within the inner chamber 110 to move the open second end 212 of the feed tube 206 from the initial height to a height H relative to the surface of the melt 104. The height H is smaller than the initial height and is a distance suitable to allow radiant heat, from the melt 104 and the heaters 114, to cause the capsule 208 to increase to a vaporizing temperature of the volatile dopant 216. The open second end 212 of the feed tube 206 is moved from the initial height to the height H at a speed rate. The positioning system 242 is used to adjust the feed tube 206 to move the second open end 212 to the appropriate height H, which may be automatically controlled by the controller 220, or may be manually controlled. At step 310, the capsule 208 containing the volatile dopant 216 is heated by radiant heat from the melt 104 and the heaters 114 as the open second end 212 is moved from the initial height to the height H at the speed rate. As the capsule 208 moves toward the surface of the melt 104, the temperature of the capsule 208 increases to a suitable temperature to vaporize the volatile dopant 216, thereby producing the gaseous dopant 202. Accordingly, both the height H and the speed rate affect the rate at which the volatile dopant 216 vaporizes to form the gaseous dopant 202, also referred to herein as the vaporization rate.

Each of the height H and the speed rate are selected to control a vaporization rate of the volatile dopant 216 in the capsule 208. For example, the height H and the speed rate may be selected based on a temperature profile generated for the second end 212 at various heights above the surface of the melt 104 (shown in FIG. 5) and the phase change and reaction characteristics of the particular volatile dopant 216 that is being used. Additionally or alternatively, the height H and the speed rate are selected based on a doping efficiency profile generated for the volatile dopant 216 at various heights of the second end 212 above the surface of the melt 104 (shown in FIG. 6). The doping efficiency may also be used to select an amount of the volatile dopant 216 that is included in the charge during step 304.

At step 312, dopant species are introduced into the melt 104 while growing the body region of the single crystal silicon ingot 102 by contacting the surface of the melt 104 (i.e., at the melt-gas interface 126) with the gaseous dopant 202. As described herein, by simulating the transport mechanisms of the dopant species within the melt 104, the dopant concentration at the solid-melt interface 124 may be estimated based on a concentration of dopant species that flux into the melt from the gaseous dopant 202. The concentration of dopant taken up by the crystal ingot 102 may be determined from the dopant concentration in the melt by considering the segregation coefficient and the solidification ratio of the dopant, and the resistivity of the growing ingot 102 may thereby be determined. In this regard, the vaporization rate is controlled to introduce a suitable amount of dopant species into the melt 104 that are taken up by the ingot 102, and to control the rate at which the dopant species are taken up by the ingot 102 to maintain a resistivity of the body region over an axial length of the body region. On this basis, the height H and the speed at which the second end 212 moves to the height H may be selected as described above.

For example, the vaporization rate may be controlled such that the dopant species is introduced at a rate sufficient to maintain a resistivity of the body region within a predetermined range (e.g., between about 0.01 ohm-cm and about 200 ohm-cm, between about 20 ohm-cm and about 200 ohm-cm, between about 30 ohm-cm and about 100 ohm-cm, or between about 60 ohm-cm and about 80 ohm-cm) and to control variations in the resistivity of the body region to within +/−15% over an axial length of at least (no less than) 300 mm, at least 500 mm, or even at least 800 mm. In some examples, the vaporization rate may be controlled such that the dopant species is introduced at a rate sufficient to maintain a resistivity of the body region within a predetermined range (e.g., between about 30 ohm-cm and about 100 ohm-cm, or between about 60 ohm-cm and about 80 ohm-cm) and to control variations in the resistivity of the body region to within +/−10% over an axial length of at least 300 mm, of at least 500 mm, or even at least 800 mm.

At step 312, the feed tube 206 remains at the position where the open second end 212 has the height H above the surface of the melt 104 for a suitable duration to allow gaseous dopant 202 to exit the feed tube 206 at the evaporation rate. The stay time of the feed tube 206 at the position during step 312 may be an additional control variable determined by the above-described considerations. After step 312, the positioning system 242 may raise the feed tube 206 so that the second end 212 is at the initial height. The positioning system 242 is used to adjust the feed tube 206 to move the second open end 212 to the initial height, which may be automatically controlled by the controller 220 once the controller 220 determines that the stay time of the second end 212 at height H has elapsed, or may be manually controlled.

In some embodiments, the method 300 may repeat at step 304 and one or multiple subsequent charges of the volatile dopant 216 are successively added into the feed tube 206, vaporized into gaseous dopant 202, and dopant species from the subsequent batch of gaseous dopant 202 are introduced into the melt 104 at step 312. Each of the multiple charges of the volatile dopant 216 are added after dopant species from a previous charge of the volatile dopant 216 have been introduced into the melt 104. Each of the multiple charges may include the same type of volatile dopant 216 or a different volatile dopant 216 as a previous charge. The feed tube 206 may be repositioned so that the second end 212 is at the initial height for each subsequent charge of volatile dopant 216.

Figure 8:
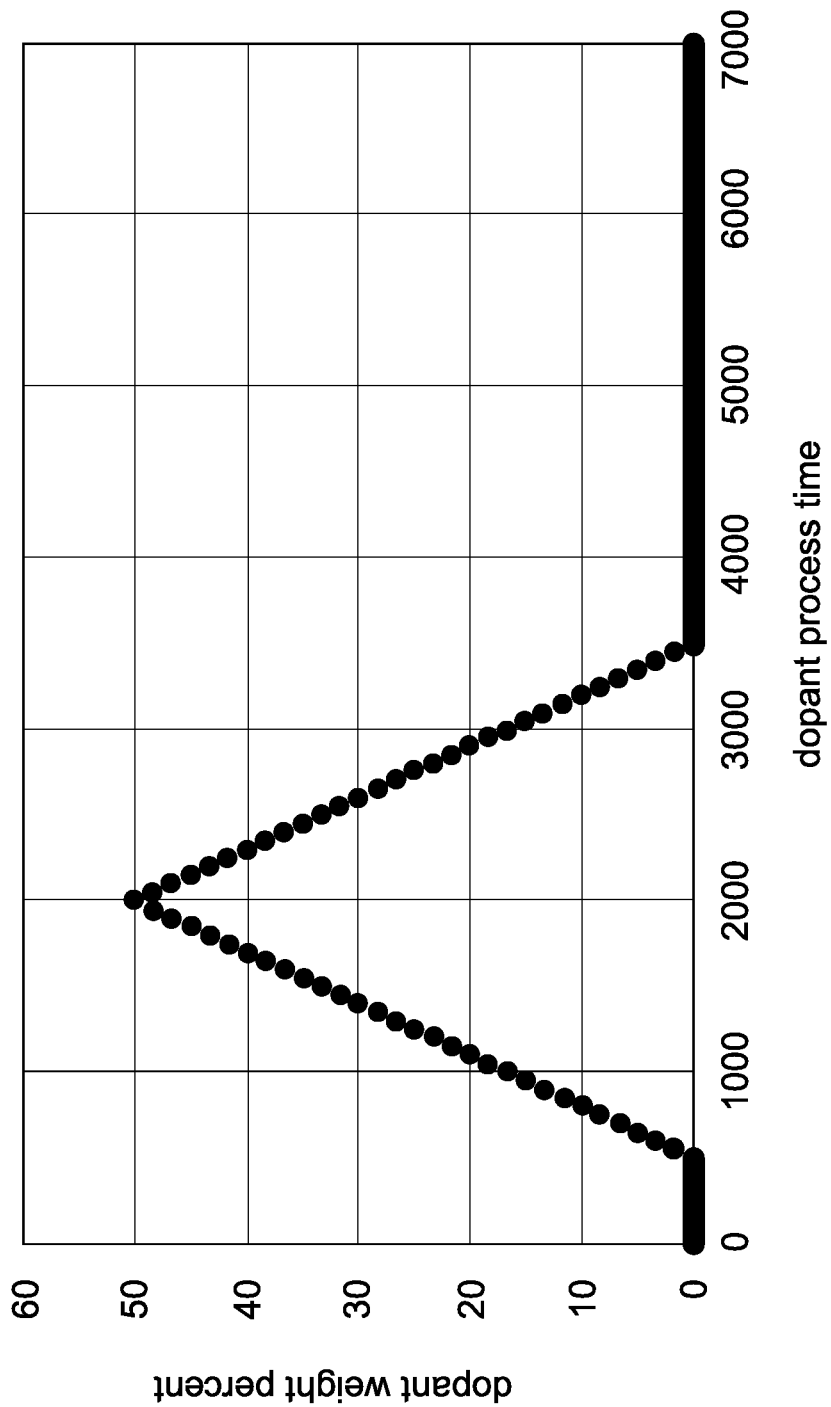
FIG. 8 is a plot showing gaseous dopant control over time during a gas doping process.
Figure 9:
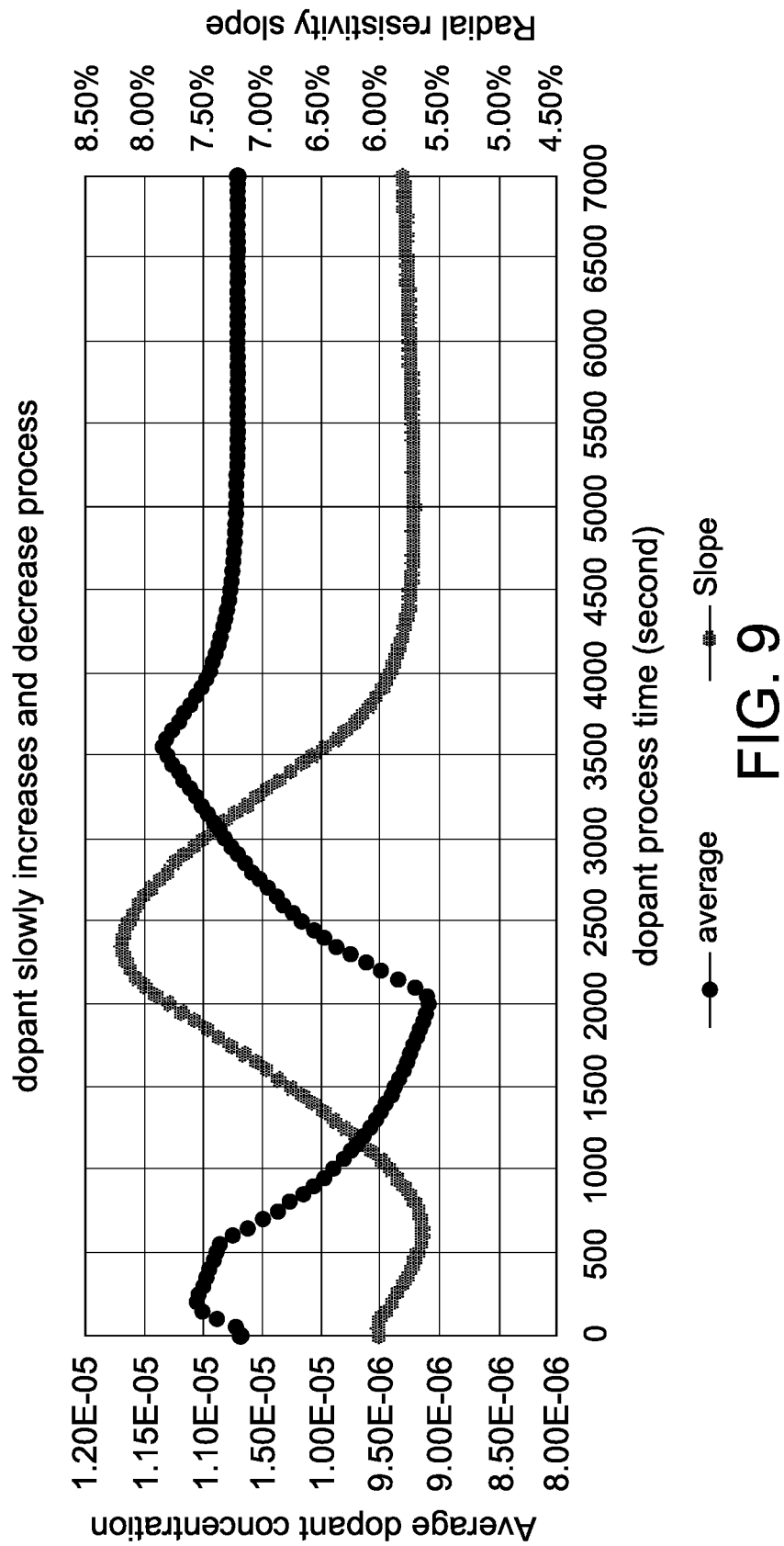
FIG. 9 is a plot showing the average dopant concentration in the silicon melt and radial resistivity change in a growing ingot during the gas doping process.
Figure 10:
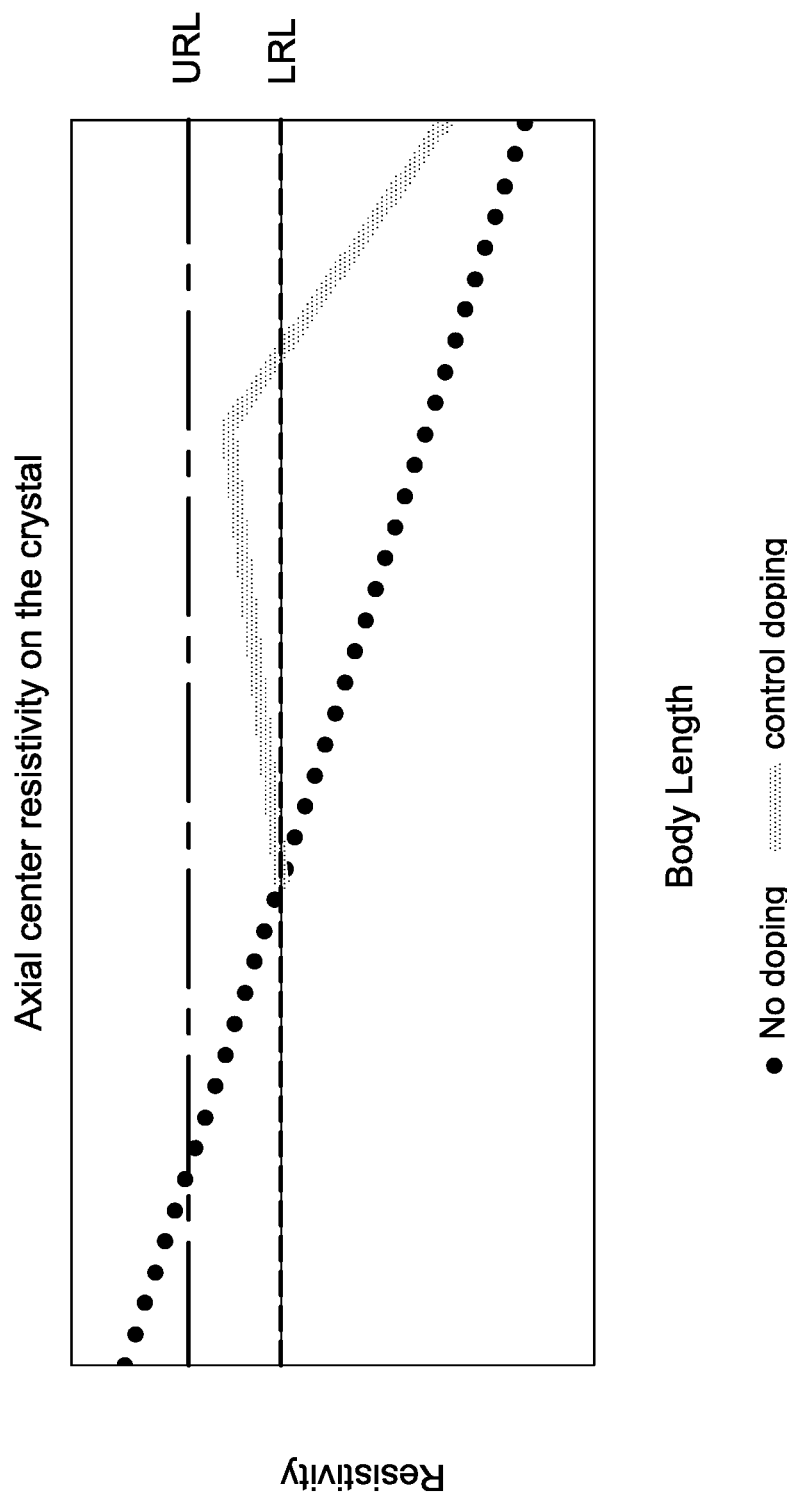
FIG. 10 is a plot showing the axial resistivity change along a growing ingot during a crystal growth process, with and without a gas doping process.
Figure 11:
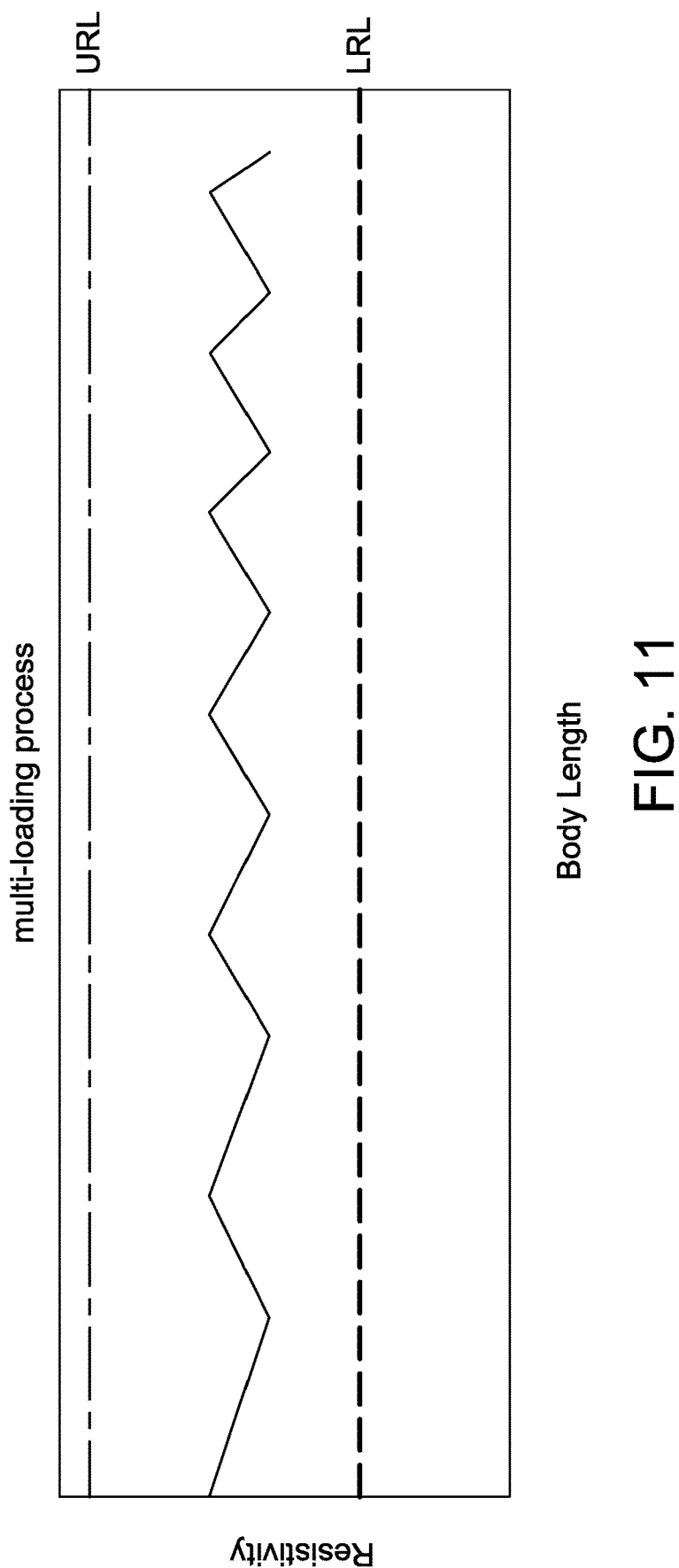
FIG. 11 is a plot showing axial resistivity control along a growing ingot during a crystal growth process using a multi-loading gas doping process.

Referring to FIGS. 8-11, gas dopant control and resulting resistivity in an ingot 102 grown according to the method 300 are shown. FIG. 8 is a plot showing gaseous dopant control over time during a gas doping process. As shown in FIG. 8, the evaporation rate of the volatile dopant 216 may be controlled, based on the selected height H and the speed rate of the second end 212 moving to the second height H, such that the amount of gaseous dopant 202 produced increases and subsequently decreases at controlled, linear rates. FIG. 9 is a plot showing average dopant concentration in the silicon melt 104 (at the solid-melt interface 124) and radial resistivity change in a growing ingot 102 during the gas doping process shown in FIG. 8. As shown in FIG. 9, the amount of the dopant at the solid-melt interface 124 increases to a maximum dopant concentration at a constant rate and subsequently decreases at a constant rate under the control region (gas dopant process time), consistent with the rate of production of the gaseous dopant 202 shown in FIG. 8. FIG. 9 also shows that the radial resistivity slope across a diameter of the ingot 102, calculated as the difference of the resistivity at the axial center of the ingot 102 and the edge of the ingot 102 divided by the average resistivity, (res cent-res edge)/average, decreases and subsequently decreases at a controlled rate under the control region. Thus, controlling the vaporization rate translates to control of dopant species at the solid-melt interface 124 and radial resistivity control of the growing ingot 102. FIG. 10 is a plot showing axial resistivity change along a growing ingot during a crystal growth process, with and without a gas doping process. As shown in FIG. 10, without the gas doping process, axial resistivity of the main body portion of the ingot 102 steadily decreases and falls below the lower resistivity limit (LRL) once the main body portion reaches a certain axial length (e.g., about 500 mm). When the controlled gas doping process according to the present disclosure is used, which may be initiated at the point where the resistivity would otherwise fall below the LRL, axial resistivity is maintained within a range between the LRL and an upper resistivity limit (URL) over a substantial portion of the axial length of the main ingot body (e.g., about 1000 mm). Axial resistivity may further be improved and maintained within the range between the LRL and the URL using multiple loads of volatile dopants 216 at suitable intervals (shown in FIG. 11). The range defined by the URL and the LRL may be, for example, +/−15% of a targeted resistivity, +/−13% of a targeted resistivity, or +/−10% of a targeted resistivity. The axial resistivity of the main body ingot may be maintained within the range defined by the URL and the LRL over an axial length of at least 300 mm, of at least 500 mm, or even at least 800 mm.

Figure 12:
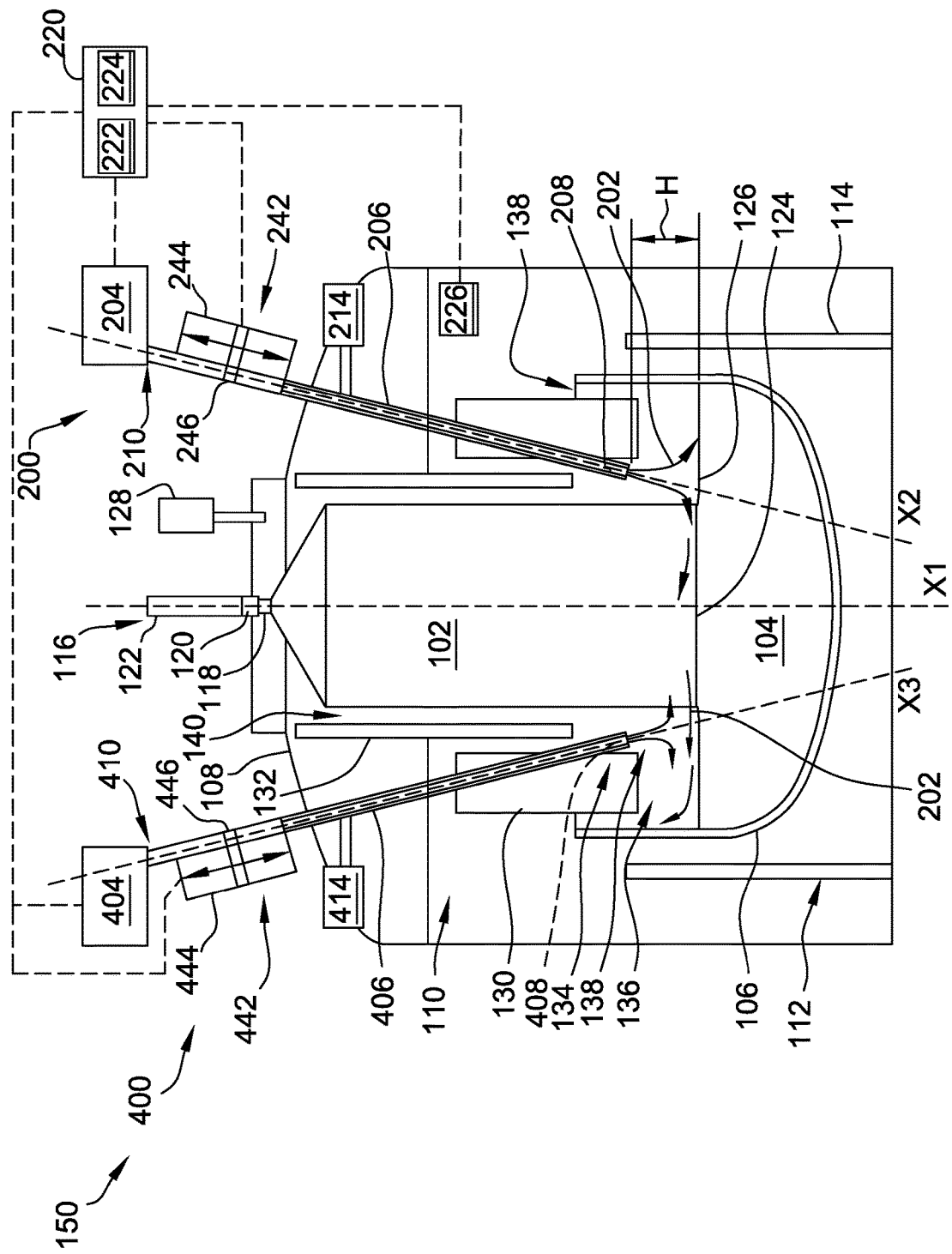
FIG. 12 is a schematic cross-section of another example ingot pulling apparatus including two gas doping systems.

Referring to FIG. 12, another example ingot puller is indicated generally at 150. The ingot puller 150 includes the same features and elements of ingot puller 100 shown in FIG. 1 and described herein. In addition, the ingot puller 150 includes a second gas doping system 400 for introducing the gaseous dopant 202 into the melt 104. The doping system 400 includes features and elements similar to those included in the gas doping system 200 shown in FIG. 1 and described herein. The ingot puller 150 that includes both the gas doping system 200 and the gas doping system 400 may facilitate improving control of base resistivity of ingots 102 grown by the ingot puller 150.

As above for the gas doping system 200 (which may be referred to as a "first gas doping system 200"), the gas doping system 400 (which may be referred to as a "second gas doping system 400") includes a dopant feed source 404, a feed tube 406, and an evaporation capsule 408. The feed tube 406 extends along a feed tube axis $X_3$ between a first end 410 and a second end 412. The first end 410 is located adjacent to the dopant feed source 404, and the second end 412 is located within the inner chamber 110 and oriented toward the surface of the melt 104. The feed tube 406 may extend between the first end 410 and the second end 412 through a valve assembly (not shown) that provides an ingress point for the feed tube 406 through the outer housing 108, and seals the ingress point when the feed tube 406 is removed from the ingot puller 150. The feed tube 406 is open at the first end 410 to receive volatile dopant (e.g., volatile dopant 216 shown in FIG. 2) from the dopant feed source 404 and open at the second end 412 to allow gaseous dopant 202 to flow out from the second end 412 of the feed tube 406 toward the surface of the melt 104 and, particularly, toward the melt-gas interface 126. The feed tube 406 may be angled with respect to the pulling axis $X_2$ and may have similar configurations or orientations as those described above for feed tube 206.

The doping system 400 may also include an inert gas supply 414 coupled in fluid communication with the feed tube 406 to guide gaseous dopant 202 out from the feed tube 406 through the second end 412 and to reduce back flow of gaseous dopant 202, as described above for inert gas supply 214 in the doping system 200.

The first end 410 of the feed tube 406 is coupled in flow communication with the dopant feed source 404. The dopant feed source 404 feeds a volatile dopant 216, which may be in the form of solid-phase dopant or liquid phase dopant, into the first end 410 of the feed tube 406, as described above for the dopant feed source 204 of doping system 200. The dopant feed source 404 may be automated, partially automated, or manually operated. Automated control of the dopant feed source 404 may be facilitated by the controller 220 communicatively coupled to the dopant feed source 404. The controller 220 may be programmed to control the frequency and/or amount of volatile dopant 416 being fed into the feed tube 406 by the dopant feed source 404.

The evaporation capsule 408 is disposed within the feed tube 406 proximate the second end 412, and within the inner chamber 110, as described above for the evaporation capsule 208 shown in FIG. 2. The feed tube 406 and the evaporation capsule 408 may have the same configuration as the feed tube 206 and evaporation capsule 208 shown in FIGS. 1 and 2 and described above. The feed tube 406 may include a guide (e.g., guide 238) and a fluid-distribution plate as described above for the feed tube 206.

The feed tube 406 is slidingly coupled to a positioning system 442 that raises and/or lowers feed tube 406 along the feed tube axis $X_3$. The positioning system 442 includes a rail 444, a coupling member 446, and a motor (not shown). The coupling member 446 slidingly couples the feed tube 406 to the rail 444. The motor moves the coupling member 446 and the feed tube 406 along the rail 444. The rail 444 extends in a direction substantially parallel to the feed tube axis $X_3$. Using the positioning system 442, the second end 412 of the feed tube 406 and the evaporation capsule 408 raised and lowered into and out of the inner chamber 110. Additionally, the positioning system 442 facilitates adjusting a height of the second end 412 above the melt-gas interface 126 (which may be similar to the height H of the second end 212 of the feed tube 206 described above). The positioning system 442 is communicatively coupled to the controller 220, and the controller 220 may be programmed to control the positioning system 442 to dynamically adjust the height of the second end 412 of the feed tube 406 above the melt-gas interface 126 during a crystal growth process as well as the speed at which the feed tube 406 moves along the rail 444 to adjust the height of the second end 412, as described above with respect to the positioning system 242. The height to which the second end 412 of the feed tube 406 is moved may be the same as the height H of the second end 212 of the feed tube 206, described above, and the speed at which the feed tube 406 moves to adjust the height of the second end 412 may be the same as the speed at which the feed tube 206 moves to adjust the height of the second end 212. Alternatively, the second end 212 of the feed tube 206 may be moved to the height H at a first speed rate, and the second end 412 of the feed tube 406 may be moved to a second height that is different from the height H and/or may be moved at a second speed rate that is different than the first speed rate.

Ingot pullers and associated gas doping systems and methods of the present disclosure provide an improvement over known ingot pullers that facilitate doping of ingots using gaseous dopants. By controlling a height of a feed tube above a silicon melt surface, a movement speed of the feed tube, and a stay time of the feed tube at a controlled height during a doping process, the vaporization rate of volatile dopant in the feed tube may be finely tuned and controlled. Consequently, the amount of dopant species introduced into the melt and the rate at which dopant species are introduced are controlled to achieve and maintain a base resistivity of a growing ingot.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

Unless otherwise indicated, approximating language, such as "generally," "substantially," and "about," as used herein indicates that the term so modified may apply to only an approximate degree, as would be recognized by one of ordinary skill in the art, rather than to an absolute or perfect degree. Accordingly, a value modified by a term or terms such as "about," "approximately," and "substantially" is not to be limited to the precise value specified. In at least some instances, the approximating language may correspond to the precision of an instrument for measuring the value. Additionally, unless otherwise indicated, the terms "first," "second," etc. are used herein merely as labels, and are not intended to impose ordinal, positional, or hierarchical requirements on the items to which these terms refer. Moreover, reference to, for example, a "second" item does not require or preclude the existence of, for example, a "first" or lower-numbered item or a "third" or higher-numbered item.

As various changes could be made in the above constructions and methods without departing from the scope of the invention, it is intended that all matter contained in the above description and shown in the accompanying drawings shall be interpreted as illustrative and not in a limiting sense.

What is claimed is:

1. An ingot pulling apparatus for growing a doped single crystal silicon ingot, the apparatus comprising:
   an outer housing defining an inner chamber;
   a crucible disposed within the inner chamber for holding a silicon melt; and
   a gas doping system for introducing dopant species into the melt, the gas doping system comprising:
      a feed tube extending between a first end and a second end, the second end located in the inner chamber, the feed tube including a capsule disposed proximate the second end;
      a dopant feed source coupled in flow communication with the first end of the feed tube, the dopant feed source being configured to add volatile dopant to the feed tube;
      a positioning system configured to adjust the position of the feed tube between a first position, in which the second end of the feed tube is at a first height above a surface of the melt, and a second position, in which the second end of the feed tube is at a second height above the surface of the melt that is smaller than the first height; and
      a controller communicatively coupled to the dopant feed source and the positioning system, the controller being configured to cause the dopant feed source to add a targeted amount of volatile dopant to the feed tube and to cause the positioning system to move the feed tube to the second position at a speed rate, each of the second height and the speed rate being selected to control a vaporization rate of the volatile dopant in the feed tube during an ingot pulling process.

2. The apparatus of claim 1, further comprising a second gas doping system for introducing dopant species into the melt, the second gas doping system comprising:
   a second feed tube extending between a first end and a second end, the second end of the second feed tube located in the inner chamber, the second feed tube including a second capsule disposed proximate the second end;
a second dopant feed source coupled in flow communication with the first end of the second feed tube, the dopant feed source being configured to add a volatile dopant to the second feed tube; and
a second positioning system configured to adjust the position of the second feed tube between a first position, in which the second end of the second feed tube is at a first height above a surface of the melt, and a second position, in which the second end of the second feed tube is at a second height above the surface of the melt that is smaller than the first height;
wherein the controller is communicatively coupled to the second dopant feed source and the second positioning system and configured to cause the second dopant feed source to add a targeted amount of the volatile dopant to the second feed tube and to cause the second positioning system to move the second feed tube to the second position at a speed rate, each of the second height and the speed rate of the second feed tube being selected to control a vaporization rate of the volatile dopant in the second feed tube during the ingot pulling process.

3. The apparatus of claim 2, wherein the second height of the second feed tube is different from the second height of the feed tube.

4. The apparatus of claim 2, wherein the speed rate of the second feed tube is different from the speed rate of the feed tube.

5. The apparatus of claim 1, further comprising a heat shield surrounding a growth chamber within the inner chamber through which a single crystal silicon ingot is grown, wherein the second end of the feed tube in the second position is located in a channel within the growth chamber defined by the heat shield.

6. The apparatus of claim 1, further comprising a heat shield surrounding a growth chamber within the inner chamber through which a single crystal silicon ingot is grown, the heat shield defining a gap above the surface of the melt, wherein the second end of the feed tube in the second position is located in the gap.

7. The apparatus of claim 1, wherein the controller is configured to determine the second height and the speed rate based on a simulated temperature profile of the second end of the feed tube as a function of a height of the second end relative to the surface of the melt.

8. The apparatus of claim 1, wherein the controller is configured to determine the second height and the speed rate based on a doping efficiency profile of the volatile dopant as a function of a height of the second end relative to the surface of the melt.

9. The apparatus of claim 1, wherein the dopant feed source is configured to add a charge of a solid dopant into the feed tube.

10. The apparatus of claim 9, wherein the solid dopant is a solid n-type dopant.

11. The apparatus of claim 9, wherein the solid dopant is a solid p-type dopant.

12. The apparatus of claim 11, wherein the solid dopant is boric acid.

13. An ingot pulling apparatus for growing a doped single crystal silicon ingot, the apparatus comprising:
an outer housing defining an inner chamber;
a crucible disposed within the inner chamber for holding a silicon melt; and
a first gas doping system and a second gas doping system for introducing dopant species into the melt, the first and second gas doping systems each comprising:
a feed tube extending between a first end and a second end, the second end located in the inner chamber, the feed tube including a capsule disposed proximate the second end;
a dopant feed source coupled in flow communication with the first end of the feed tube, the dopant feed source being configured to add a volatile dopant to the feed tube;
a positioning system configured to adjust the position of the feed tube between a first position, in which the second end of the feed tube is at a first height above a surface of the melt, and a second position, in which the second end of the feed tube is at a second height above the surface of the melt that is smaller than the first height; and
a controller communicatively coupled to the dopant feed source and the positioning system, the controller being configured to cause the dopant feed source to add a targeted amount of the volatile dopant to the feed tube and to cause the positioning system to move the feed tube to the second position, the second height being selected to control a vaporization rate of the volatile dopant in the feed tube during an ingot pulling process.

14. The apparatus of claim 13, wherein the second height of the feed tube of the second gas doping system is different from the second height of the feed tube of the first gas doping system.

15. The apparatus of claim 13, wherein the controller of each of the first and second gas doping systems is configured to cause the respective positioning system to move the respective feed tube at a speed rate that is selected to control a vaporization rate of the volatile dopant in the respective feed tube.

16. The apparatus of claim 15, wherein the speed rate of the feed tube of the second gas doping system is different from the speed rate of the feed tube of the first gas doping system.

17. The apparatus of claim 13, further comprising a heat shield surrounding a growth chamber within the inner chamber through which a single crystal silicon ingot is grown, wherein the second end of each feed tube in the second position is located in a channel within the growth chamber defined by the heat shield.

18. The apparatus of claim 13, further comprising a heat shield surrounding a growth chamber within the inner chamber through which a single crystal silicon ingot is grown, the heat shield defining a gap above the surface of the melt, wherein the second end of each feed tube in the second position is located in the gap.

19. The apparatus of claim 13, wherein the controller of each of the first and second gas doping systems is configured to determine the second height of the second end of the respective feed tube based on at least one of i) a simulated temperature profile of the second end of the respective feed tube as a function of a height of the second end relative to the surface of the melt and ii) a doping efficiency profile of the volatile dopant as a function of a height of the second end relative to the surface of the melt.

20. The apparatus of any of claim 13, wherein the dopant feed source of each of the first and second gas doping systems is configured to add a charge of a solid boric acid dopant into the feed tube.

* * * * *